(12) United States Patent
Ueda

(10) Patent No.: US 7,439,595 B2
(45) Date of Patent: Oct. 21, 2008

(54) FIELD EFFECT TRANSISTOR HAVING VERTICAL CHANNEL STRUCTURE

(75) Inventor: Tetsuzo Ueda, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 236 days.

(21) Appl. No.: 11/287,482

(22) Filed: Nov. 28, 2005

(65) Prior Publication Data

US 2006/0157804 A1 Jul. 20, 2006

(30) Foreign Application Priority Data

Nov. 30, 2004 (JP) ............................. 2004-345565

(51) Int. Cl.
*H01L 29/76* (2006.01)
(52) U.S. Cl. ...................... 257/401; 257/329; 257/496; 257/E29.13; 257/E29.118
(58) Field of Classification Search ................ 257/329, 257/401, 496, 623, E29.13, E29.118, E29.122
See application file for complete search history.

(56) References Cited

U.S. PATENT DOCUMENTS 5,889,298 A * 3/1999 Plumton et al. ............. 257/285

6,107,660 A * 8/2000 Yang et al. .................. 257/329
6,506,638 B1 * 1/2003 Yu ............................. 438/156
7,242,056 B2 * 7/2007 Chaudhry et al. ........... 257/329

OTHER PUBLICATIONS

J-I. Nishizawa, et al.; "The 2.45 GHz 36 W CW Si Recessed Gate Type SIT with High Gain and High Voltage Operation," IEEE Transactions on Electron Devices, vol. 47, No. 2, Feb. 2000, pp. 482-487.
V. Camarchia, et al.; "Physics-Based Modeling of Submicron GaN Permeable Base Transistors," IEEE Electron Device Letters, vol. 23, No. 6, Jun. 2002, pp. 303-305.

* cited by examiner

*Primary Examiner*—Matthew E Warren
(74) *Attorney, Agent, or Firm*—Dickinson Wright, PLLC

(57) ABSTRACT

A first $SiO_2$ thin film, a tungsten gate electrode, and a second $SiO_2$ thin film are selectively formed on a first $n^+$-type GaN contact semiconductor layer in that order and in a multilayer film structure having the three layers, a stripe-shaped opening is formed. Via the opening, an undoped GaN channel semiconductor layer and the second $n^+$-type GaN contact semiconductor layer are formed so that both the layers are regrown by, for example, metal organic chemical vapor deposition. A source electrode and a drain electrode are formed so as to contact the corresponding second and first $n^+$-type GaN contact semiconductor layers. The regrown undoped GaN channel semiconductor layer and the regrown second $n^+$-type GaN contact semiconductor layer are horizontally grown portions and hence, the contact area of the electrode can be made larger than the area of the opening.

15 Claims, 13 Drawing Sheets

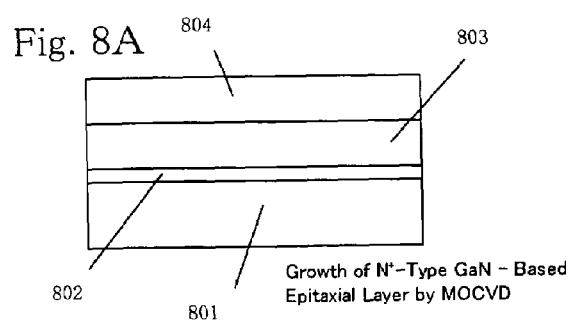

Fig. 8A

Growth of N⁺-Type GaN – Based Epitaxial Layer by MOCVD

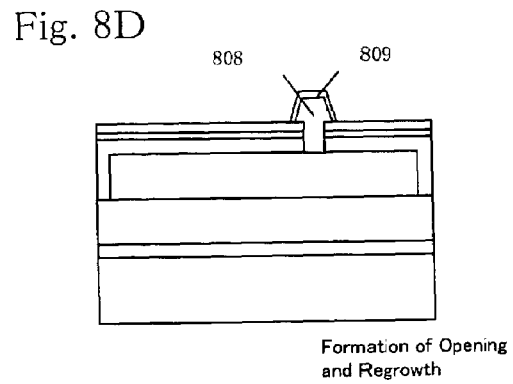

Fig. 8D

Formation of Opening and Regrowth

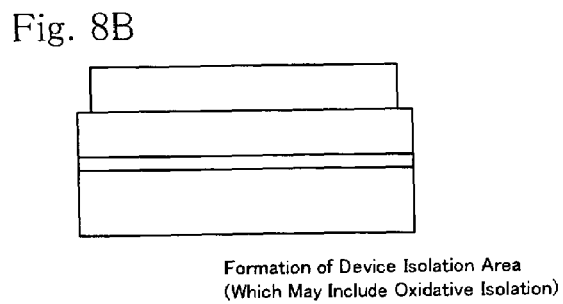

Fig. 8B

Formation of Device Isolation Area (Which May Include Oxidative Isolation)

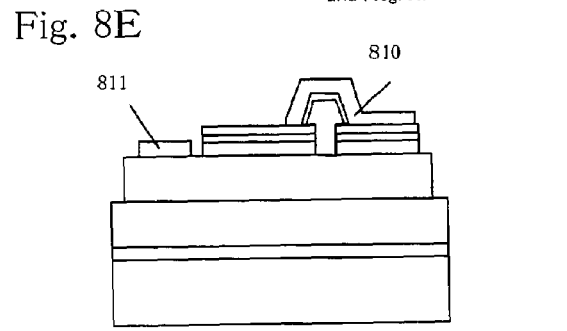

Fig. 8E

Etching of Insulating Film / Gate Electrode / Insulating Film and Formation of Source Electrode and Drain Electrode (Resist Lift-Off)

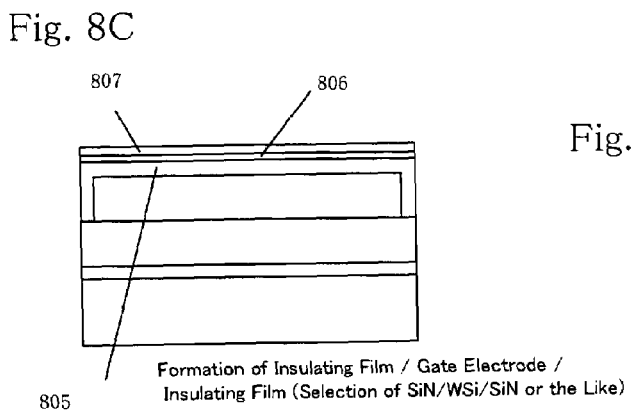

Fig. 8C

Formation of Insulating Film / Gate Electrode / Insulating Film (Selection of SiN/WSi/SiN or the Like)

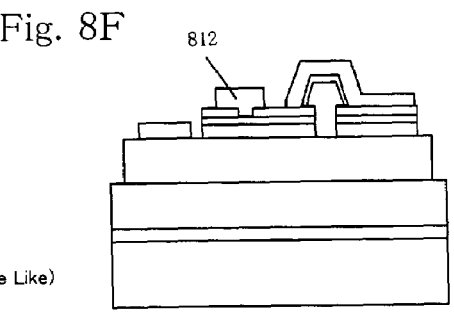

Fig. 8F

FIELD EFFECT TRANSISTOR HAVING VERTICAL CHANNEL STRUCTURE

BACKGROUND OF THE INVENTION

1. Field of the Invention

The present invention relates to a field effect transistor having a vertical channel which uses, for example, a nitride semiconductor and to a manufacturing method for the field effect transistor. This field effect transistor can be applied to, for example, high-power transistors used in power supply circuits of consumer electronics and to high-frequency transistors used in transmitting and receiving circuits of cellular telephones, extremely high-frequency radars, and the like.

2. Background Art

Group III nitride compound semiconductors represented by GaN have characteristics in that since the band gaps of GaN and AlN are as high as 3.4 eV and 6.2 eV at room temperature respectively, they have high breakdown electric field strength and that the saturated drift velocity of their electrons is high when compared with that of compound semiconductors such as GaAs or Si semiconductors. Because of this, the group III nitride compound semiconductors are expected to be used for high-voltage, high-power electronic devices and are being researched and developed extensively.

Besides, at the AlGaN/GaN hetero-interface, free electron are generated at their hetero interface by spontaneous polarization and piezo polarization perpendicular to the (0001) plane, thereby a sheet carrier concentration of $1 \times 10^{13}$ cm$^{-2}$ or higher can be achieved even when they are not doped. Because of this, reported Group III Nitride high-power or high-frequency transistors are heterojunction field effect transistors taking advantage of the inherent high density of two-dimensional electron gas at the hetero interface.

In such a horizontal channel transistor structure, there needs to secure a sufficient distance between a gate and a drain to increase the breakdown voltage. Because of this, when the horizontal channel transistor structure is applied to large-current transistor, problems arise in that their chip area is increased and it is difficult to produce them at low cost.

As a device structure by which a large-current device with a smaller chip area can be realized, there is a transistor with a vertical structure which is called "PBT" (permeable base transistor) or "SIT" (static induction transistor).

In Si semiconductors, a mesa structure, that is, a structure in which a source electrode and a drain electrode are formed on the upper stage and lower stage of a convex structure respectively, a gate electrode is formed on the sidewall of the upper stage of the convex structure, and a channel current is controlled by a gate voltage applied to the gate electrode has been proposed and it characteristics have been recognized (see Electron Devices, 47(2000) 482, by J. Nishizawa et al., IEEE Trans.). Moreover, for the transistor with the vertical structure using a group III Nitride semiconductor, its structural proposition and results of its device simulation have been reported.

An example of structures of heretofore reported field effect transistors with vertical structures (PBTs) using group III Nitride semiconductors will be described below.

FIG. 13 is a cross-sectional view of a structure of a conventional vertical channel transistor using a group III Nitride semiconductor. In FIG. 13, reference numeral 1301 denotes a first n$^+$-type GaN layer, reference numeral 1302 a n$^-$-type GaN layer, reference numeral 1303 a second n$^+$-type GaN layer, reference numeral 1304 a drain electrode, reference numeral 1305 a gate electrode, and reference numeral 1306 a source electrode.

In the vertical channel transistor, the first n$^+$-type GaN layer 1301 is formed on the drain electrode 1304 and on the layer 1301, the n$^-$-type GaN layer 1302 with a convex structure is formed. As shown in FIG. 13, the gate electrode 1305 is formed so that the electrode 1305 contacts the lower stage and the sidewall of the upper stage of the convex structure. The second n$^+$-type GaN layer 1303 is formed on the upper stage of the convex structure and on the layer 1303, the source electrode 1306 is formed.

In this vertical channel transistor, a current flowing between the source and the drain is controlled by a voltage to the gate electrode 1305, thereby a field effect transistor can be realized (see Electron Device Letters, 23(2002) 303, by V. Camarchia et al., IEEE).

For this structure, there is a report on the simulation results of its device characteristics. In this report, to achieve sufficient pinch-off characteristics, the width of the upper stage of the convex structure is set at about 0.2 μm and in the field effect transistor, the thickness of its gate electrode is set at 20 nm. Such a structure realizes, a very small-area high-power transistor with a high current density and a low on resistance.

However, in the vertical channel field effect transistor shown in FIG. 13, the area of the source electrode formed on the upper stage of the convex structure is small. Besides, the group III nitride semiconductors have large band gaps and generally have high electrode contact resistance, which makes the series resistance of transistors very high. As a result, reduction of the on resistance is limited by the large electrode contact resistance.

SUMMARY OF THE INVENTION

An object of the present invention is to provide a field effect transistor with a lower on resistance and a vertical channel structure and to provide a method for manufacturing the field effect transistor.

Specifically, the invention is directed to a vertical channel field effect transistor, which is composed of, for example, a group III nitride semiconductor and which has a lower on resistance resulting from the reduction of a contact resistance at a source or drain electrode reduced by increasing the area of the electrode when compared with the cross-sectional area of the vertical channel, and to provide a method for manufacturing the field effect transistor including a epitaxial regrowth process.

To solve the problems, a field effect transistor according to a first aspect of the invention has a first contact semiconductor layer, a gate electrode formed above the first contact semiconductor layer, openings in the gate electrode, a channel semiconductor layer formed so that the layer penetrates the openings and its lower portion contacts the first contact semiconductor layer, a second contact semiconductor layer formed so that the layer contacts the upper portion of the channel semiconductor layer, a first source or drain electrode formed so that the electrode contacts the first contact semiconductor layer, and a second source or drain electrode formed so that the electrode contacts the second contact semiconductor layer, the carrier concentration of the channel semiconductor layer is lower than those of the first and second contact semiconductor layer, and the contact area of the second contact semiconductor layer and the second source or drain electrode is larger than the area of the opening.

According to such a structure, the channel semiconductor layer is formed so that the layer penetrates the openings of the gate electrode, the first contact semiconductor layer is formed so that the layer contacts the lower portion of the channel semiconductor layer, the second contact semiconductor layer is formed so that the layer contacts the upper portion of the channel semiconductor layer, the second source or drain electrode is formed so that the electrode contacts the second contact semiconductor layer, the first source or drain electrode is formed so that the electrode contacts the first contact semiconductor layer, the carrier concentration of the channel semiconductor layer is lower than those of the first and second contact semiconductor layer, and the contact area of the second contact semiconductor layer and the second source or drain electrode is larger than the area of the opening of the gate electrode. Because of this, it is possible to lower the contact resistance of the second source or drain electrode. As described above, in the field effect transistor with the vertical channel, since the contact area of the second source or drain electrode formed above the gate electrode and the second contact semiconductor layer can be increased and an ohmic contact resistance can be lowered, it becomes possible to realize the field effect transistor with a low series resistance. In addition, since a so-called gate length is determined based on the thickness of the gate electrode film instead of controlling and forming the gate length by using photolithography like conventional horizontal field effect transistors, the gate length can be easily shortened by reducing the thickness of the film further.

In such a structure, it is preferable that both the first and second contact semiconductor layers be n-type semiconductor layers.

Since the mobility of electrons is generally higher than that of holes in channel semiconductor layers, the field effect transistor with superior device characteristics such as low on resistance or high transconductance can be realized by adopting the structure.

In the structure, it is preferable that the carrier concentration of the second contact semiconductor layer be higher than that of the first contact semiconductor layer.

According to the structure, by making the second contact semiconductor layer, which is formed above the openings and has a small cross-sectional area, contain more impurities to increase the carrier concentration of the second contact semiconductor layer, resistance in the second contact semiconductor layer is reduced, so that it becomes possible to realize the field effect transistor with a lower series resistance.

In the structure, it is preferable that the field effect transistor have first and second insulating films, which are formed on the lower and upper portions of the gate electrode, and the openings penetrating the first insulating film, the gate electrode, and the second insulating film.

According to the structure, by forming the second insulating film between the second source or drain electrode and the gate electrode and forming the first insulating film between the first contact semiconductor layer and the gate electrode, a breakdown voltage between the electrodes is increased, so that it becomes possible to realize the high-voltage, high-power field effect transistor.

In such a structure, it is preferable that the first contact semiconductor layer be formed below the gate electrode so that the resistance of the layer is increased.

According to this structure, a parasitic capacitance between the gate electrode and the first source or drain electrode is reduced, thereby the field effect transistor with superior high-frequency characteristics can be realized.

In the structure, it is preferable that a part of the channel semiconductor layer or the first contact layer be formed under the gate electrode so that the resistance of the part is increased.

According to the structure, the parasitic resistance between the gate electrode and the first source or drain electrode is reduced, so that it becomes possible to realize the field effect transistor with superior high-frequency characteristics.

In such a structure, it is preferable that the opening be plurally provided in the same surface of the gate electrode, the channel semiconductor layer and the second contact semiconductor layer be plurally formed so that they penetrate all the openings, and the channel semiconductor layers, the second contact layers, or both of them be connected one after another above the gate electrode.

According to the structure, the larger-current transistor can be realized and the contact area of the second source or drain electrode and the contact layer can be increased further. Therefore, it becomes possible to realize the low-series resistance, high-power transistor.

In such a structure, it is preferable that the channel semiconductor layer be doped with impurities to increase its resistance.

According to such a structure, a leakage current component at the channel semiconductor layer is reduced, thereby the field effect transistor with favorable pinch-off characteristics can be realized.

In the structure, it is preferable that an air gap be formed under the region of part of a wiring metal connected to the second source or drain electrode.

According to the structure, the air gap is formed between the second source or drain electrode and the gate electrode, so that it becomes possible to realize the field effect transistor with a higher breakdown voltage.

In such a structure, it is preferable that a conductive substrate be provided below the channel semiconductor layer and the first contact semiconductor layer, a through-hole be formed between the top surface of the first contact semiconductor layer and the conductive substrate, and the first source or drain electrode, which is formed so that the electrode contacts the first contact semiconductor layer, and the conductive substrate be electrically connected with each other via the through-hole formed in the first contact semiconductor layer.

According to the structure, since the first source or drain electrode can be drawn out of the back side surface of the conductive substrate without necessitating the wiring metal for the first source or drain electrode or a pad electrode for wire connection, so that it becomes possible to realize the field effect transistor with a small chip area at a low cost.

In such a structure, it is preferable that the channel semiconductor layer and the first and second contact semiconductor layers be comprised of a compound semiconductor containing nitrogen.

According to the structure, since the group III nitride compound semiconductor has a wide band gap and a high breakdown electric field strength, the field effect transistor with a high breakdown voltage can be realized. In addition, since the group III nitride compound semiconductor has a high saturated drift velocity, for example, a higher transconductance can be achieved when the gate length is shortened sufficiently, thereby the higher-performance field effect transistor can be realized.

In such a structure, it is preferable that Mg, Zn, or Fe be added to the channel semiconductor layer as impurities.

According to the structure, the undoped channel semiconductor layer comprised of the group III Nitride compound semiconductor increases series resistance and a leakage current component reduces, so that it becomes possible to realize the field effect transistor with superior pinch-off characteristics.

In such a structure, it is preferable that the compound semiconductor, of which the first contact layer, the second contact layer, or both of them are made, be comprised of an InAlGaN quaternary mixed crystal.

According to the structure, the contact resistance of the electrodes is reduced further.

In such a structure, it is preferable that the gate electrode contain a W layer, a Mo layer, a Ta layer, a Pt layer, a Ni layer, a Pd layer, a layer comprised of silicide, or a conductive oxide layer.

According to the structure, since the metal films, the silicide film, and the conductive oxide film have high melting points and relatively high work functions, they do not degrade even at an epitaxial growth temperature on the order of 1000° C. as a mask used for the regrowth of the group III nitride semiconductor, that is, their compositions do not change and hence, favorable Schottky characteristics can be achieved, thereby, for example, the field effect transistor with a small leakage current can be realized.

In such a structure, it is preferable that the conductive oxide be comprised of a tin-doped indium oxide (ITO), a zinc oxide (ZnO), an oxide containing them, or an yttrium barium copper oxide (YBCO).

In such a structure, it is preferable that the first and second insulating films be made of any one of $SiO_2$, SiN, polyimide, and BCB (benzocyclobutene) or be formed of a multilayer film made of at least two of $SiO_2$, SiN, polyimide, and BCB (benzocyclobutene).

According to the structure, the insulating films are easy to form and have a relatively low dielectric constant, and then their breakdown voltage can be increased, so that it becomes possible to realize the field effect transistor capable of high-frequency operation and high-power operation.

The method for manufacturing the field effect transistor according to the invention includes steps of forming the first contact semiconductor layer on the substrate, forming the first insulating film, the gate electrode, and the second insulating film on the first contact semiconductor layer in that order, forming the opening which penetrates the first insulating film, the gate electrode, and the second insulating film, forming the channel semiconductor layer and the second contact semiconductor layer in that order so that both the layers penetrate the opening, forming the first source or drain electrode so that the electrode contacts the first contact semiconductor layer, and forming the second source or drain electrode so that the electrode contacts the second contact semiconductor layer. In the step of forming the channel semiconductor layer and the second contact semiconductor layer, the carrier concentration of the channel semiconductor layer is made lower than those of the first and second contact semiconductor layers and the contact area of the second contact semiconductor layer and the second source or drain electrode is made larger than the area of the opening.

According to such a method, in the step of forming the channel semiconductor layer and the second contact semiconductor layer, the carrier concentration of the channel semiconductor layer is made lower than those of the first and second contact semiconductor layers and the contact area of the second contact semiconductor layer and the second source or drain electrode is made larger than the area of the opening. As a result, in the field effect transistor with the vertical channel, it is possible to increase the contact area of the second source or drain electrode and the second contact semiconductor layer formed above the gate electrode and to lower the ohmic contact resistance, which realizes the field effect transistor with a low series resistance. In addition, as in the case of the field effect transistor according to the invention, since the so-called gate length is determined based on the thickness of the gate electrode film, the gate length can be easily shortened by reducing the thickness of the film further.

In the manufacturing method, it is preferable that the following steps be taken: in the step of forming the opening, the opening is plurally formed in the same surface of the gate electrode; in the step of forming the channel semiconductor layer and the second contact semiconductor layer, the layers are formed so that the layers penetrate all the openings; and in the step of forming the channel semiconductor layer and the second contact semiconductor layer, the layers are formed so that the individual portions of the channel semiconductor layer, the individual portions of the second contact semiconductor layer, or the individual portions of both the layers, which have been grown via the adjacent openings, are connected to one another.

According to the structure, it is possible to realize a larger-current transistor and to increase the contact area of the second source or drain electrode and the second contact semiconductor layer further. Therefore, the high-power transistor with a low series resistance can be realized.

In the step of forming the channel semiconductor layer and the second contact semiconductor layer included in the method, it is preferable that the formation step be stopped and a step of planarizing the channel semiconductor layer or the second contact semiconductor layer be etching or polishing be included.

According to the method, the film thickness of the channel semiconductor layer or the second contact semiconductor layer can be reduced, which allows the high-power transistor with a lower series resistance to be realized.

In such a method, it is preferable that a temperature at which the channel semiconductor layer and the second contact semiconductor layer are formed be set at a temperature at which the composition of the gate electrode does not change.

According to the method, since the composition of the gate electrode does not change, favorable Schottky characteristics are achieved and hence, for example, the field effect transistor with a small leakage current can be realized.

In such a method, it is preferable that the channel semiconductor layer and the first and second contact semiconductor layers be comprised of a compound semiconductor containing nitrogen.

According to the method, since the group III nitride compound semiconductor has a wide band gap and a high breakdown electric field strength, it is possible to realize the field effect transistor with a high breakdown voltage. In addition, since the group III nitride compound semiconductor has a high saturated drift velocity, for example, a higher transconductance can be achieved when the gate length is shortened sufficiently, thereby the higher-performance field effect transistor can be realized.

As described above, according to the field-effect transistor of the invention, since it is possible to increase the contact area of the second source or drain electrode and the second contact semiconductor layer formed above the gate electrode, the ohmic contact resistance can be lowered, thereby the field effect transistor with a low series resistance can be realized. Moreover, since the so-called gate length is determined based on the thickness of the gate electrode film instead of controlling and forming the gate length by using photolithography like the conventional horizontal field effect transistors, the gate length can be easily shortened by reducing the thickness of the film further.

Furthermore, according to the manufacturing method for the field effect transistor of the invention, in the field effect transistor with the vertical channel, since it is possible to increase the contact area of the second source or drain electrode and the second contact semiconductor layer formed above the gate electrode, the ohmic contact resistance can be lowered, thereby the field effect transistor with a low series resistance can be realized. In addition, since the so-called gate length is determined based on the thickness of the gate electrode film, the gate length can be easily shortened by reducing the thickness of the film further.

BRIEF DESCRIPTION OF THE DRAWINGS

FIGS. 8A to 8F are process drawings for explaining a manufacturing method for the field effect transistor with the vertical channel according to the first embodiment of the invention;

DESCRIPTION OF THE EXEMPLARY EMBODIMENTS

A first embodiment according to the present invention will be described below with reference to the drawings.

A field effect transistor having a vertical channel and a method for manufacturing the same according to the first embodiment have the following feature: a first insulating film, a gate electrode, and a second insulating film are selectively formed on a first n-type contact semiconductor layer in that order, and then an stripe-shaped opening is formed in the multilayer film structure comprised of the three layers; an undoped channel semiconductor layer and a second n-type contact semiconductor layer are formed via the opening so that both the layers are regrown by, for example, metal organic chemical vapor deposition; a drain electrode is formed so that the drain electrode contacts the first n-type contact semiconductor layer; a source electrode is formed so that the source electrode contacts the second n-type contact semiconductor layer; and the regrowth undoped channel semiconductor layer and second n-type contact semiconductor layer are portions which are grown in the horizontal direction of the transistor and hence, it is possible to make the contact areas of the electrodes larger than that of the opening.

Figure 1:
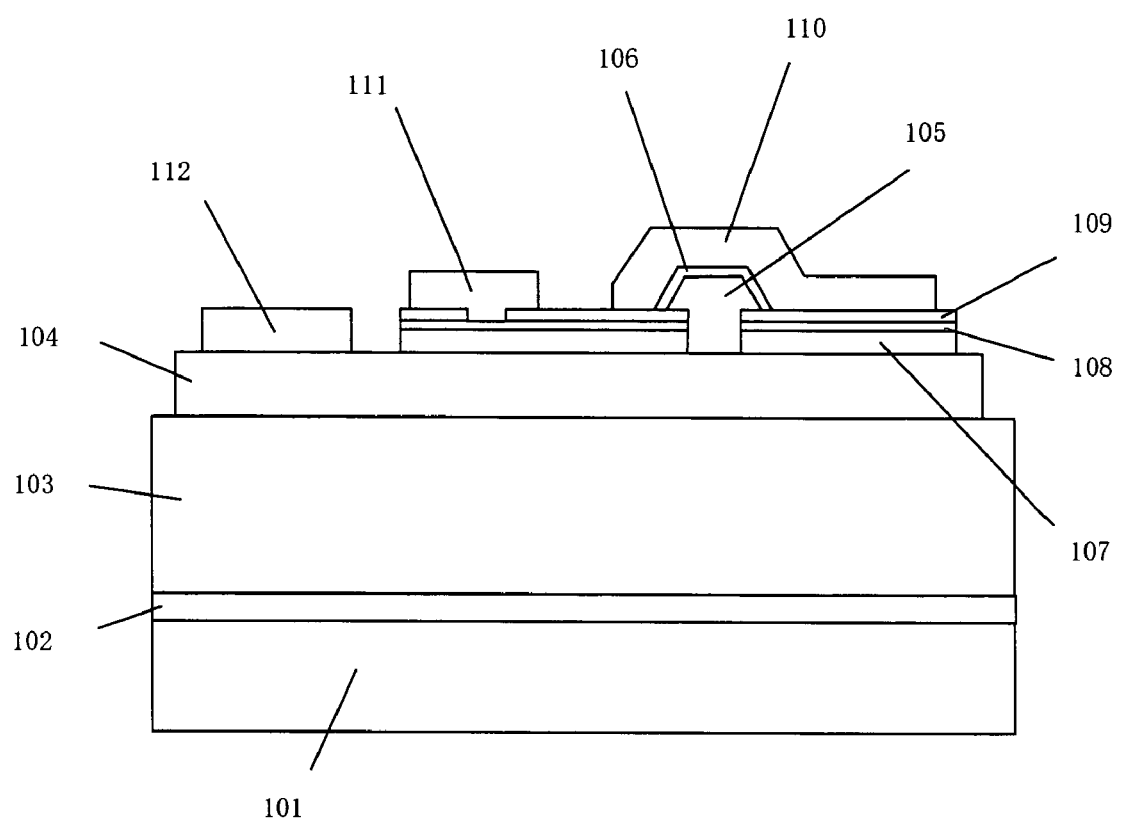
FIG. 1 is a cross-sectional view of a field effect transistor with a vertical channel according to a first embodiment of the present invention.

FIG. 1 is a cross-sectional view of the field effect transistor having the vertical channel according to the first embodiment of the invention. In FIG. 1, reference numeral 101 denotes a sapphire substrate, reference numeral 102 an AlN buffer layer, reference numeral 103 a first undoped GaN layer, reference numeral 104 a first $n^+$-type GaN layer (first contact semiconductor layer), reference numeral 105 a second undoped GaN layer (channel semiconductor layer) which is a regrowth layer, reference numeral 106 a second $n^+$-type GaN layer (second contact semiconductor layer) which is a regrowth layer, reference numeral 107 a first $SiO_2$ thin film, reference numeral 108 a tungsten (W) gate electrode, reference numeral 109 a second $SiO_2$ thin film, reference numeral 110 a Ti/Al/Ni/Au source electrode, reference numeral 111 a Ti/Au gate pad electrode, and reference numeral 112 a Ti/Al/Ni/Au drain electrode.

In the field effect transistor having the vertical channel shown in FIG. 1, the first $SiO_2$ thin film 107, the tungsten gate electrode 108, and the second $SiO_2$ thin film 109, which have the opening, are formed on the first $n^+$-type GaN layer 104. Via the opening, the second undoped GaN layer 105 is formed, and then the second $n^+$-type GaN layer 106 is formed. And further, the Ti/Al/Ni/Au drain electrode 112 is formed of contacting the first $n^+$-type GaN layer 104 and the Ti/Al/Ni/Au source electrode 110 is formed of contacting the second $n^+$-type GaN layer 106.

Moreover, the Ti/Al/Ni/Au source electrode 110 is formed of contacting the second $SiO_2$ thin film 109. Because of this, the area of the Ti/Al/Ni/Au source electrode 110 can be increased as compared with that of the second $n^+$-type GaN layer 106. As a result, it becomes possible to increase the degree of the margin of mask alignment and implement a field effect transistor having a low series resistance with superior reproducibility.

In this case, the AlN buffer layer 102 of 0.5 μm in thickness, the first undoped GaN layer 103 of 3 μm, and the first $n^+$-type GaN layer 104 of 500 nm in thickness are formed on the sapphire substrate 101 in that order.

Furthermore, the first $SiO_2$ thin film 107 of 500 nm in thickness, the tungsten gate electrode 108 of 50 nm in thickness, and the second $SiO_2$ thin film 109 of 500 nm in thickness are selectively formed on the first $n^+$-type GaN layer 104 in that order.

In this case, W is used as the gate electrode, while a metal such as Mo, Pt, Pd, Ta, or Ni or an alloy such as WSi may be used.

Figure 2:
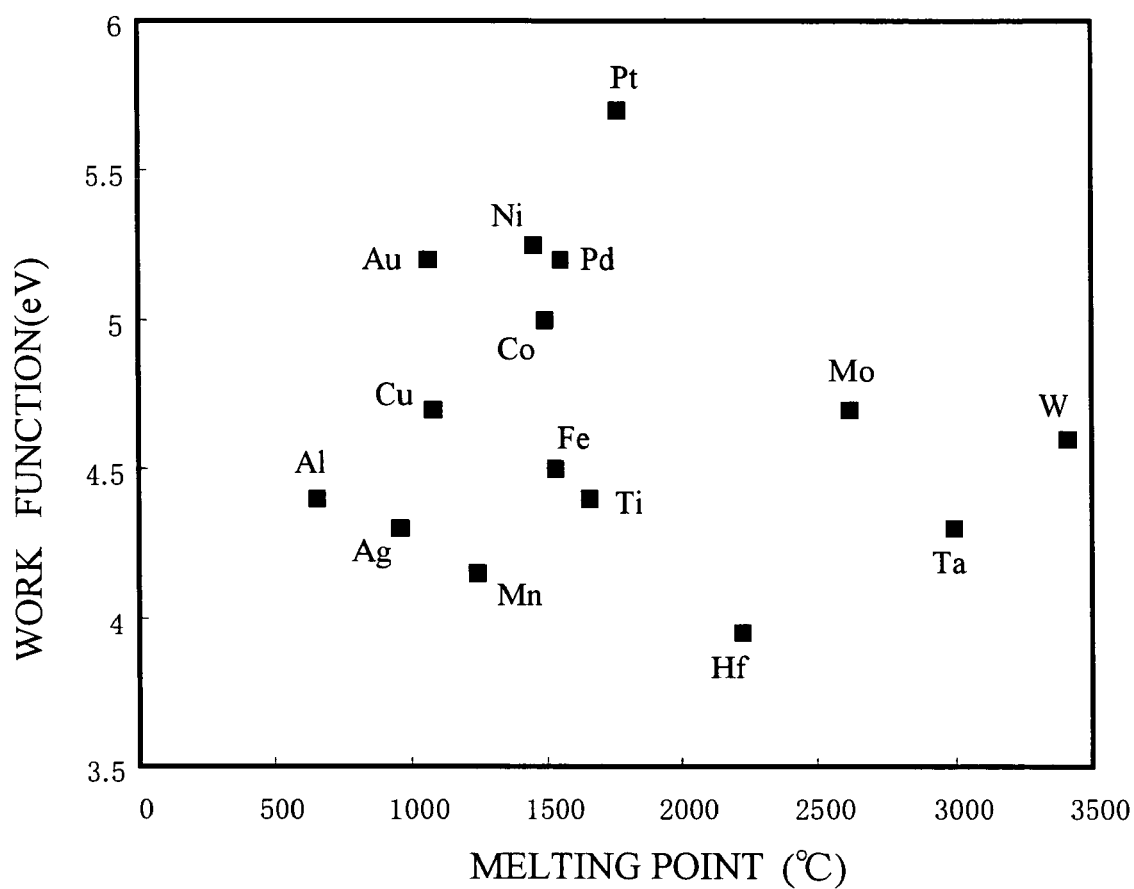
FIG. 2 is a graph for explaining a relationship between work functions and melting points of single metals.

For example, to regrow the GaN layer at a temperature of 1050° C. after the formation of the gate electrode, it is desirable that the gate electrode have a high melting point and since there is a need to make its Schottky Junction with the GaN, it is desirable that the work function of the gate electrode be large. FIG. 2 is a graph for explaining relationships between metallic materials' melting points and work functions. As shown in FIG. 2, it is desirable to use W, Mo, and so on, that is, the metallic materials with a melting point of 1500° C. or higher and a work function of 4.5 eV or larger.

In addition to the single metals shown in FIG. 2, the gate electrode may be formed by using silicide materials such as WSi and conductive oxide films such as ITO (indium tin oxide), ZnO, and YbaCuO which is a superconducting material. In those cases as well, it is desirable that their work functions be larger.

The Ti/Al/Ni/Au drain electrode 112 is formed on a portion of the first n$^+$-type GaN layer 104 where the multilayer film structure, which is comprised of the first and second SiO$_2$ thin films 107 and 109 and the tungsten gate electrode 108, is not formed.

The first n$^+$-type GaN layer 104 is selectively removed on the first undoped GaN layer 103 for device isolation.

And further, for example, a 0.2-μm-wide stripe-shaped opening is formed in the multilayer film structure comprised of the first and second SiO$_2$ thin films 107 and 109 and the tungsten gate electrode 108. Via the opening, the second undoped GaN layer 105 of 1.2 μm in thickness and the second n$^+$-type GaN layer 106 of 50 nm in thickness are selectively formed so that both the layers are regrown. It is desirable that the first and second n$^+$-type GaN layer 104 and 106 be doped with a high concentration of Si. For example, it is desirable that both the layers be doped with Si having a concentration of up to about $1\times10^{19}$ cm$^{-3}$.

By adopting such a structure, the contact resistance of the source electrode and the drain electrode can be sufficiently lowered and hence, it becomes possible to implement a field effect transistor with a lower series resistance.

In addition, being doped with Si, the n-type layers having a higher concentration of Si and a lower resistance can be implemented in the group III nitride compound semiconductor, thereby it becomes possible to implement a field effect transistor with a lower series resistance.

As shown in FIG. 1, on the regrowth layer, that is, on the second n$^+$-type GaN layer 106, the Ti/Al/Ni/Au source electrode 110 is formed.

Moreover, the second SiO$_2$ thin film 109 is provided with the opening and the Ti/Au gate pad electrode 111 is formed so that the electrode 111 contacts the tungsten gate electrode 108.

In this case, a current flowing between the source and the drain is controlled by a depletion layer in the regrowth undoped GaN layer, that is, the second undoped GaN layer 105 formed by applying a negative voltage to the tungsten gate electrode 108, thereby the operation of the field effect transistor can be implemented.

Also, in this case, to improve a breakdown voltage between the electrodes further, it is preferable that the first and second SiO$_2$ thin film 107 and 109 be thicker. To make a threshold voltage for the field effect operation lower, it is preferable that the residual carrier concentration of the second undoped GaN layer 105 be made as low as possible. For example, the layer 105 can be doped with Mg, Zn, Fe, or the like instead of the undoping to increase its resistance.

Figure 3:
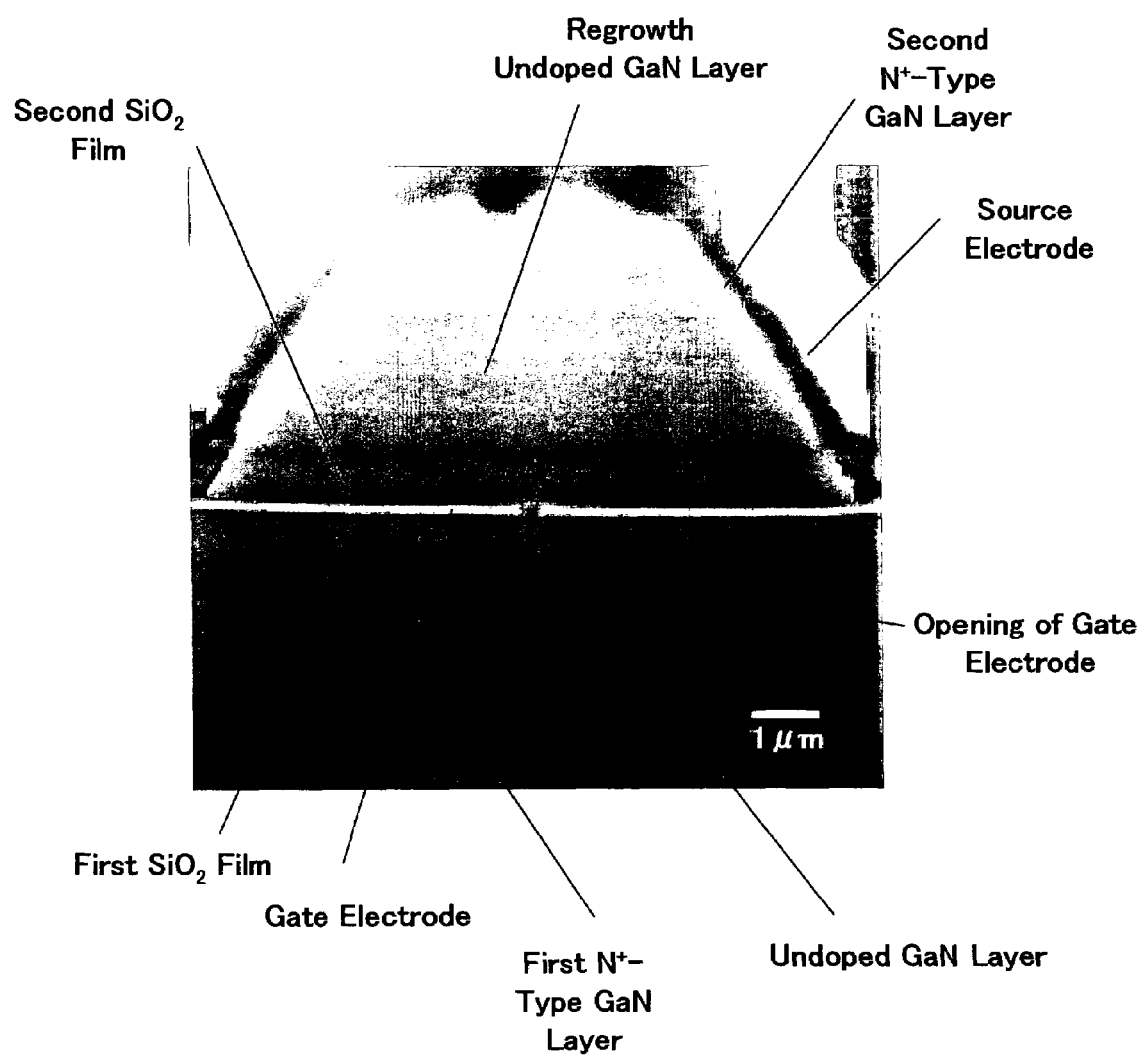
FIG. 3 is a SEM photograph of the cross section of the regrowth portion of the field effect transistor with the vertical channel according to the first embodiment of the invention.

FIG. 3 is a SEM photograph of the cross section of a regrowth portion around the actually fabricated source electrode. Here, the contact area of the electrode can be more than doubled when compared with the area of the opening. In FIG. 3, it is ten times or more.

The carrier concentration of the second n$^+$-type GaN layer 106 may be higher than that of the first n$^+$-type GaN layer 104. Moreover, instead of the second n$^+$-type GaN layer 106, a n$^+$-type InAlGaN layer (quaternary mixed crystal) may be used. By adopting such a structure, the contact resistance of the electrode is reduced further.

Moreover, part of the second undoped GaN layer or at least part of the first n$^+$-type GaN layer may be formed below the gate electrode so that the resistance of the part is increased.

Furthermore, instead of the first SiO$_2$ thin film 107 or the second SiO$_2$ thin film 109, a low-dielectric constant film such as BCB (benzocyclobutene) and polyimide may be used. By using such a film, a parasitic capacitance can be reduced. Moreover, instead of the first SiO$_2$ thin film 107 or the second SiO$_2$ thin film 109, a SiN thin film may be used. Through the use of such a film, it is possible to suppress a so-called current collapse phenomenon in which a current is decreased after the application of a large voltage.

In this case, the sapphire substrate 101 is used, while a SiC substrate, a GaN substrate, or a Si substrate may be used as the substrate. When a conductive substrate is used, the first n$^+$-type GaN layer 104 may be connected to the conductive substrate through, for example, a via hole and metal wiring and the drain electrode may be formed on the rear surface of the substrate.

Moreover, to improve the reliability of the transistor further, for example, a SiO$_2$ mask layer having a stripe-shaped opening may be formed on the AlN buffer layer 102 formed on the sapphire substrate 101, and then the first undoped GaN layer 103 and the first n$^+$-type GaN layer 104 may be regrown. By adopting such a structure, the crystal defect densities of the portions of the first undoped GaN layer 103 and the first n$^+$-type GaN layer 104 on the unopened portion of the SiO$_2$ mask layer are reduced. At the reduced defect portions thus obtained, a vertical channel is formed. And further, since the crystal defect densities of the portions of the first undoped GaN layer 103 and the first n$^+$-type GaN layer 104 on the stripe-shaped opening of the SiO$_2$ mask layer are higher than those of the other portion, it is preferable that the vertical channel be not provided above these portions.

In this case, the unopened portion of the SiO$_2$ mask layer is formed below the opening of the gate electrode, the second undoped GaN layer 105 is located on the first n$^+$-type GaN layer 104 formed in such a way that the layer 104 horizontally grows above the SiO$_2$ mask layer, and the crystal defect density of the second undoped GaN layer 105 is set at $10^7$ cm$^{-2}$ or lower.

In such a structure, the mobility of the carriers within the channel semiconductor layer is improved and a high-performance field effect transistor having a lower series resistance and a high transconductance can be implemented. And further, since the crystal defect density is low, it becomes possible to implement a more reliable field effect transistor.

In addition, since the crystal defects is reduced by horizontally growing the first n$^+$-type GaN layer 104 above the mask layer, the crystal defect density can be lowered despite the degree of crystal defect density of the underlying layer, thereby a high-performance high-reliability field effect transistor can be implemented.

Incidentally, as the mask layer, SiN and a multilayer film comprised of SiO$_2$ and SiN may be used in addition to SiO$_2$.

By using SiO$_2$ or SiN as the mask used for its horizontal growth as described above, the crystal defect density can be lowered easily because, for example, the group III nitride semiconductor does not degrades even at its crystal growth temperature at around 1000° C., that is, its composition does not change, thereby a higher-performance higher-reliability field effect transistor can be implemented.

According to the vertical field effect transistor according to the embodiment, unlike the conventionally proposed formation of the electrode on the small mesa in which the channel is formed, it is possible to form the contact portion of the source electrode whose area is larger than that of the opening which means the channel width. Because of this, a vertical field effect transistor having a lower contact resistance and a lower series resistance can be implemented.

Specifically, a vertical field effect transistor having a lower on resistance can be implemented. Besides, unlike conventional horizontal field effect transistors in which by photolithography gate lengths are controlled and the gates are formed, a so-called gate length is determined based on the thickness of the tungsten gate electrode. Because of this, the thickness of the electrode film is further reduced, thereby the gate length can be shortened easily.

By using the structure described in this embodiment, the gate length of 50 nm or less, which has been very difficult to be achieved in the conventional horizontal field effect transistors, can be achieved without necessitating a high-cost process step such as electron-beam lithography. As a result, it becomes possible to implement a high-performance field effect transistor at a lower cost.

In this case, the drain electrode may be formed above the opening of the gate by interchanging the source electrode and the drain electrode.

Figure 4:
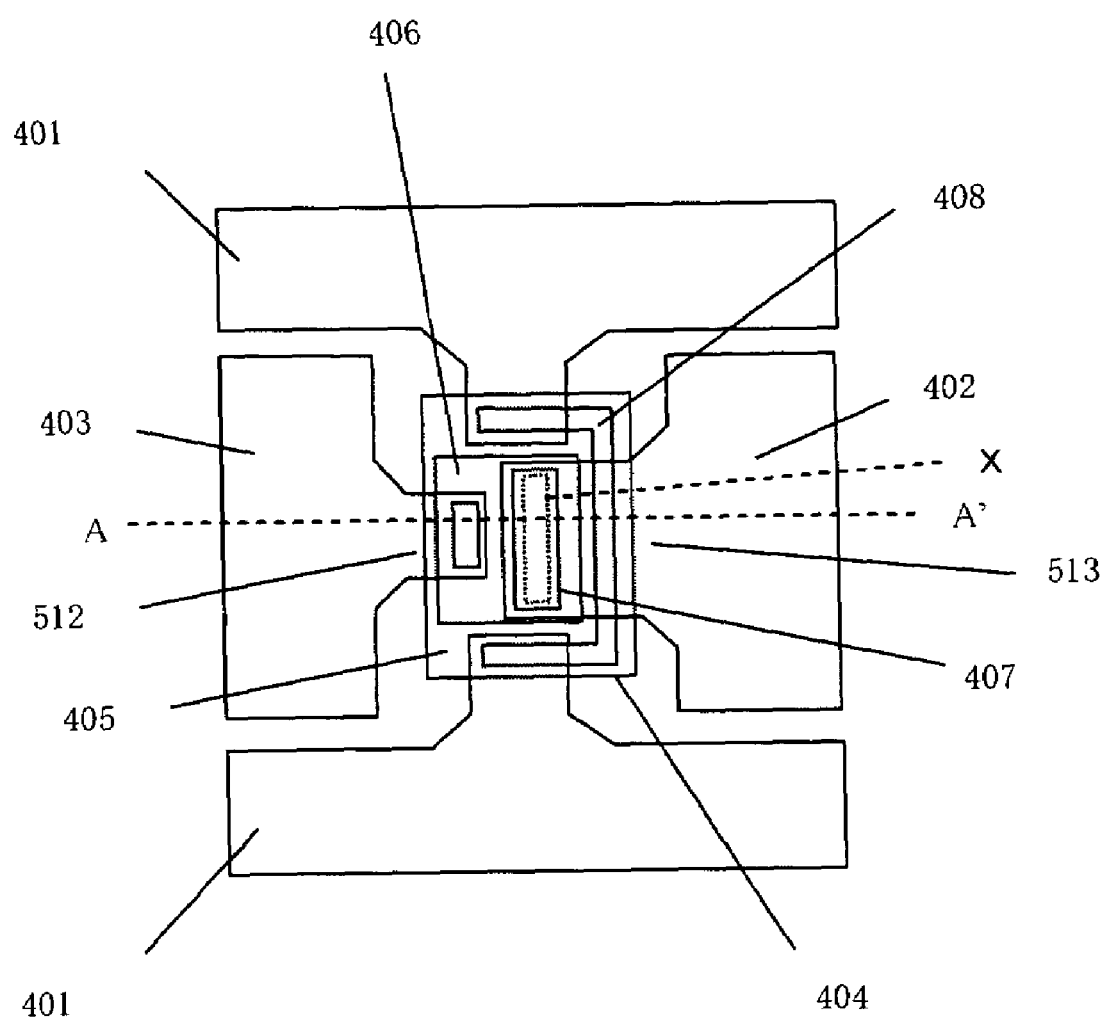
FIG. 4 is a layout of a mask pattern formed in a case where the field effect transistor with the vertical channel according to the first embodiment of the invention is applied to a high-frequency transistor.

FIG. 4 is an example of a layout on a mask of the vertical channel field effect transistor whose cross-sectional structure is shown in FIG. 1. FIG. 4 is different from FIG. 1 in that a source electrode and a drain electrode are interchanged. In FIG. 4, reference numeral 401 denotes a source pad electrode comprised of Au-plated wiring, reference numeral 402 a drain pad electrode comprised of Au-plated wiring, reference numeral 403 a gate pad electrode comprised of Au-plated wiring, reference numeral 404 a device isolation stage, reference numeral 405 a first $n^+$-type GaN layer on the source side, reference numeral 406 a second $SiO_2$ thin film, reference numeral 407 a Ti/Al/Ni/Au drain electrode formed on a second $n^+$-type GaN layer on the drain side, and reference numeral 408 a Ti/Al/Ni/Au source electrode. Reference numeral 512 denotes Au-plated gate wiring connected to the gate pad electrode 403 and reference numeral 513 denotes Au-plated drain wiring connected to the drain pad electrode 402.

Figure 5:
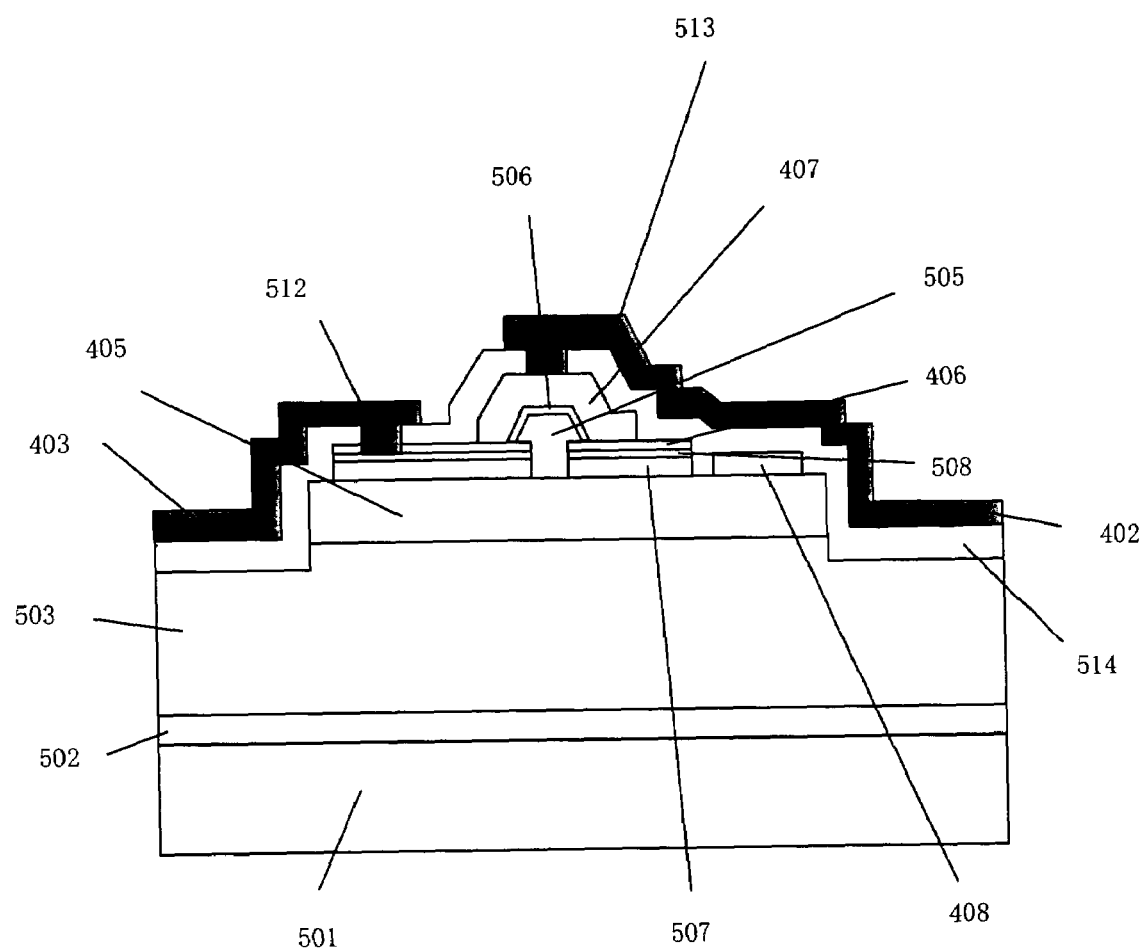
FIG. 5 is a cross-sectional view of the field effect transistor taken along line A-A' of FIG. 4.

FIG. 5 is a cross-sectional view for showing a cross-sectional structure taken along line A-A' of FIG. 4. Reference numeral 501 denotes a sapphire substrate, reference numeral 502 an AlN buffer layer, reference numeral 503 a first undoped GaN layer, reference numeral 405 a first $n^+$-type GaN layer, reference numeral 505 a second undoped GaN layer, reference numeral 506 a second $n^+$-type GaN layer, reference numeral 507 a first $SiO_2$ thin film, reference numeral 508 a tungsten gate electrode, reference numeral 406 a second $SiO_2$ thin film, reference numeral 408 a Ti/Al/Ni/Au source electrode, reference numeral 407 a Ti/Al/Ni/Au drain electrode, reference numeral 512 Au-plated gate wiring connected to the gate pad electrode 403, reference numeral 513 Au-plated drain wiring connected to the drain pad electrode 402, and reference numeral 514 a SiN passivation film under the wiring metals.

FIG. 4 is the layout drawing of the mask pattern formed in a case where the vertical field effect transistor according to the first embodiment is applied to, for example, a high-frequency small-signal transistor used for low-noise amplifier and mixer circuits. Such a mask pattern has a structure in which the gate electrode and the drain electrode are each inserted in the source electrode pattern for the evaluation of high-frequency characteristics.

To increase a drain current, for example, the dimensions of a regrowth opening illustrated in the portrait orientation of FIG. 4 (indicated by a dotted line X of FIG. 4), that is, a so-called gate width can be expanded. To increase a transconductance and a high-frequency gain, the thickness of the gate electrode can be reduced.

The source pad electrode 401, the drain pad electrode 402, and the gate pad electrode 403 each made of the Au-plated wiring are formed as shown in FIG. 5. That is, in addition to the cross-sectional structure shown in FIG. 1, for example, the SiN passivation film 514 (a $SiO_2$ thin film, or the like) is formed as in interlayer insulating film, an opening is formed in the SiN passivation film 514, and then the individual electrodes 408, 407, and 508 of the transistor are connected with the individual pad electrodes 401, 402, and 403 so that they penetrate the opening (see FIG. 4).

To decrease the parasitic capacitance further, or to increase the breakdown voltage further, an air-bridge structure can be provided to the wiring portions between the pad portions of the pad electrodes and the individual electrodes of the transistor.

In this case, the opening, which is formed in the multilayer film comprised of the tungsten gate electrode 508, and the $SiO_2$ thin films 507 and 406 and which is provided for the formation of the regrowth layer, is rectangular, while, for example, 0.2-µm-diameter holes may be made in line instead.

In the field effect transistor according to the embodiment, the Ti/Al/Ni/Au drain electrode 407 is formed so that the electrode 407 contacts the regrowth layer formed on the opening. The source electrode and the drain electrode shown in FIG. 4 may be interchanged; in that case as well, the gate pad electrode and the drain pad electrode are formed so that they are opposite to each other and are inserted in the source pad electrode.

In the vertical field effect transistor having such a structure, by, for example, further reducing the thickness of the gate electrode which determines the gate length, the transconductance and the high-frequency gain is increased further. As a result, a field effect transistor having a high cut-off frequency (fT) and high maximum oscillation frequency (fmax) can be implemented.

Figure 6:
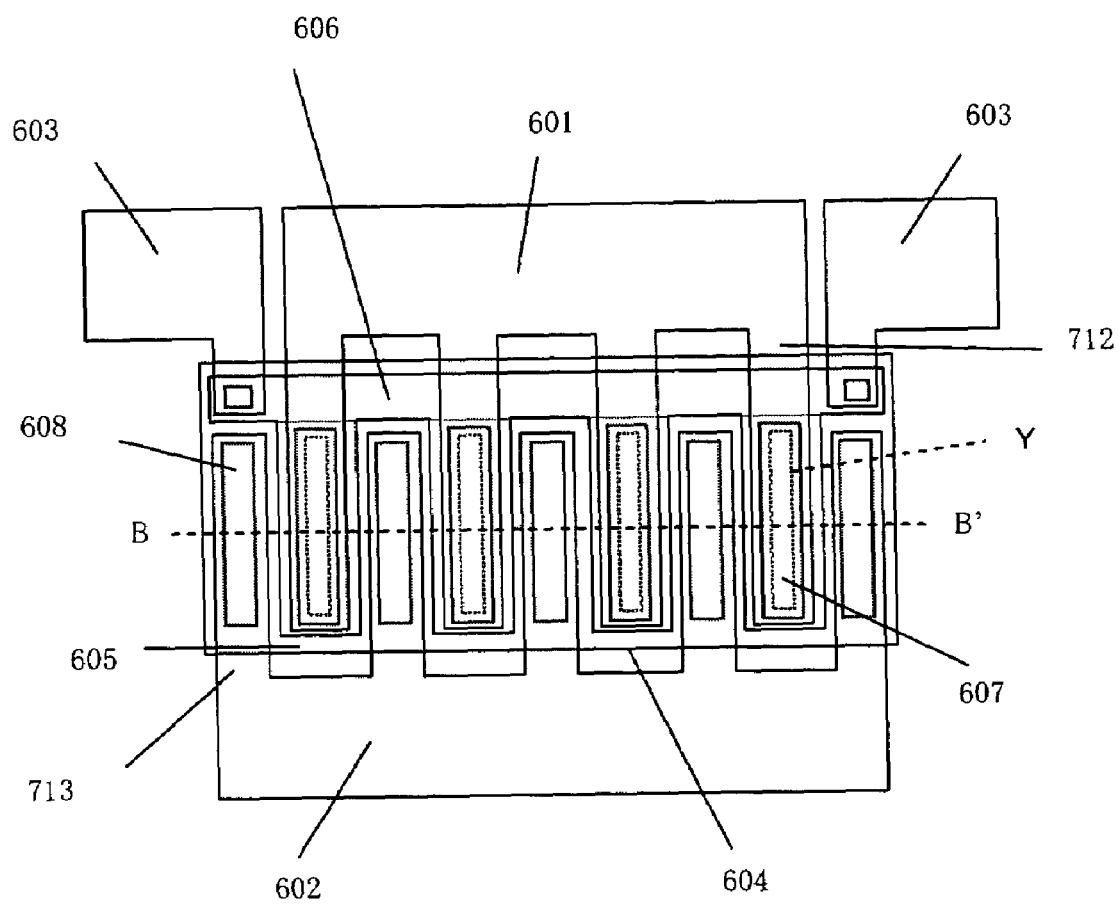
FIG. 6 is a layout of a mask pattern formed in a case where the field effect transistor with the vertical channel according to the first embodiment of the invention is applied to a high-power transistor.

FIG. 6 is another example of a layout on a mask of the vertical channel field effect transistor whose cross-sectional structure is shown in FIG. 1. In FIG. 6, reference numeral 601 denotes a source pad electrode comprised of Au-plated wiring, reference numeral 602 a drain pad electrode comprised of Au-plated wiring, reference numerals 603 gate pad electrodes comprised of Au-plated wiring, reference numeral 604 a device isolation stage, reference numeral 605 a first $n^+$-type GaN layer on the drain side, reference numeral 606 a second $SiO_2$ thin film, reference numeral 607 a Ti/Al/Ni/Au source electrode formed on the second $n^+$-type GaN layer on the source side, and reference numeral 608 a Ti/Al/Ni/Au drain electrode. Reference numeral 712 denotes Au-plated source wiring connected to the source pad electrode 601 and reference numeral 713 denotes Au-plated drain wiring connected to the drain pad electrode 602 comprised of the Au-plated wiring.

Figure 7:
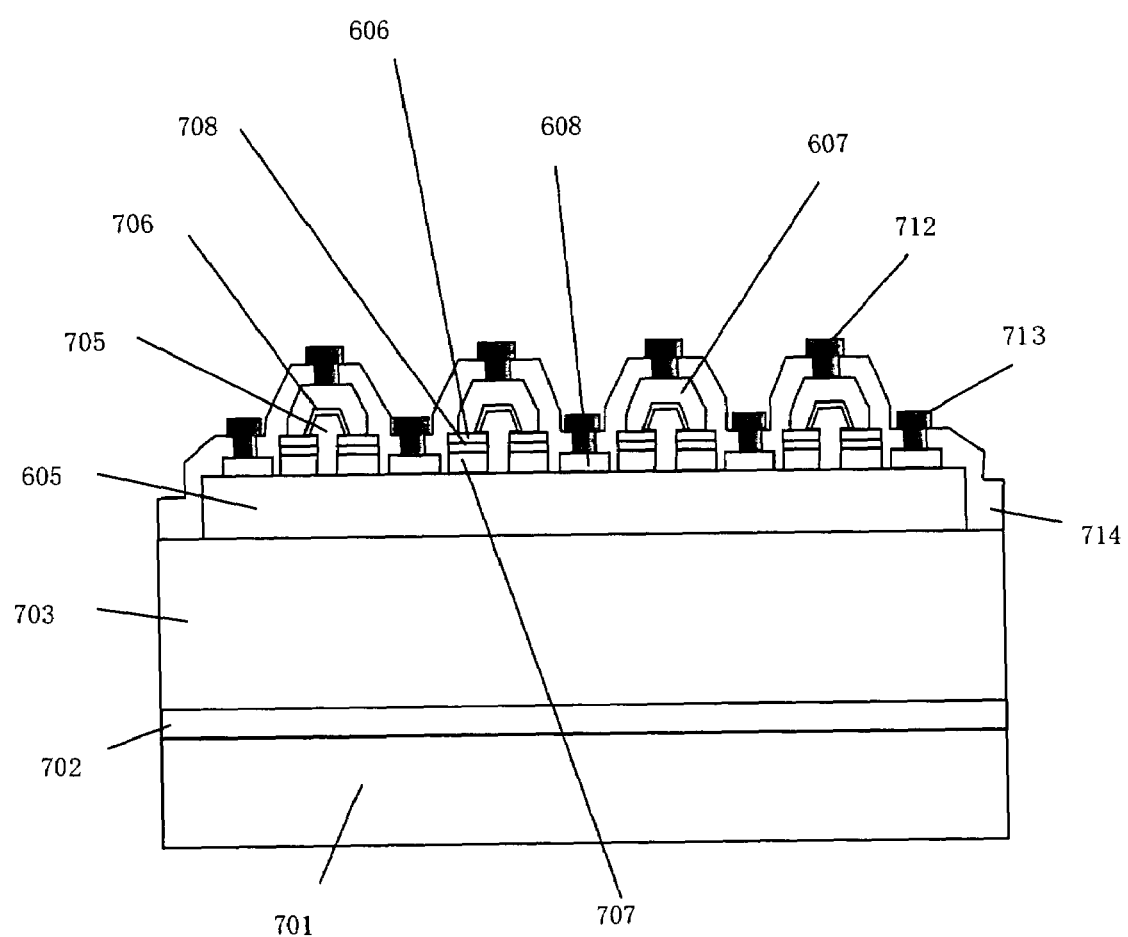
FIG. 7 is a cross-sectional view of the field effect transistor taken along line B-B' of FIG. 6.

FIG. 7 is a cross-sectional view of the field effect transistor taken along line B-B' of FIG. 6. Reference numeral 701 denotes a sapphire substrate, reference numeral 702 an AlN buffer layer, reference numeral 703 a first undoped GaN layer, reference numeral 605 a first $n^+$-type GaN layer, reference numeral 705 a second undoped GaN layer, reference numeral 706 a second $n^+$-type GaN layer, reference numeral 707 a first $SiO_2$ thin film, reference numeral 708 a tungsten gate electrode, reference numeral 606 the second $SiO_2$ thin film, reference numeral 607 the Ti/Al/Ni/Au source electrode, reference numeral 608 the Ti/Al/Ni/Au drain electrode, reference numeral 712 the Au-plated source wiring connected to the source pad electrode 601, reference numeral 713 the Au-plated drain wiring connected to the drain pad electrode 602, and reference numeral 714 a SiN passivation film under the wiring metals.

FIG. 6 is the layout drawing of the mask pattern formed in a case where the vertical field effect transistor according to the first embodiment is applied to, for example, a high-power transistor for power supply circuits. In this mask pattern, unlike the mask layout of the transistor shown in FIG. 4, a plurality of openings, on which regrowth layers (indicated by a dotted line Y of FIG. 6) are formed, are made in the multilayer film comprised of the gate electrode and the SiO$_2$ thin films. As a result, the total area of the openings becomes larger than the area of the single opening, that is, the so-called gate width is expanded, thereby the drain current is increased further.

In this case, as shown in FIG. 6, the Ti/Al/Ni/Au source electrode 607 and the Ti/Al/Ni/Au drain electrode 608 are shaped like a comb, so that the high-power transistor occupies a smaller chip area. The Ti/Au gate pad electrodes 603 are provided at two places, while the electrode 603 may be provided only at one place or at three places or more.

The source pad electrode 601, the drain pad electrode 602, and the gate pad electrode 603 each comprised of the Au-plated wiring are formed as shown in FIG. 7. That is, in addition to the cross-sectional structure shown in FIG. 1, for example, the SiN passivation film 714 (a SiO$_2$ thin film or the like) is formed as a interlayer insulating film, the openings are formed in the SiN passivation film 714, and the individual electrodes 607, 608, and 708 of the transistor are connected with the individual pad electrodes 601, 602, and 603 so that they penetrate h the openings (see FIG. 6).

In this case, the openings, which are formed in the multilayer film comprised of the tungsten gate electrode 708 and the SiO$_2$ thin films 707 and 606 and which are provided for the formation of the regrowth layers, are rectangular, while, for example, 0.2-μm-diameter holes may be made in line instead. And further, the source electrode and the drain electrode may be interchanged. Still further, a wiring metal, which is provided in a so-called via hole formed in the first undoped GaN layer 703, may be connected to a conductive substrate such as a Si substrate and a drain electrode may be formed on the rear surface of the conductive substrate. In that case, there is no need to form a drain pad electrode on a mask pattern on its surface side, so that it becomes possible to achieve a smaller chip area.

To manufacture the vertical channel field effect transistors whose cross sections are shown in FIGS. 1, 5, and 7 and whose layouts of the mask patterns are shown in FIGS. 4 and 6, for example, the use of a manufacturing method shown in FIGS. 8A to 8F can be considered.

FIGS. 8A to 8F are cross-sectional views of the field effect transistor having the vertical channel according to the first embodiment of the invention illustrated in the order of steps included in the manufacturing method therefor. In these figures, reference numeral 801 denotes a sapphire substrate, reference numeral 802 an AlN buffer layer, reference numeral 803 a first undoped GaN layer, reference numeral 804 a first n$^+$-type GaN layer, reference numeral 805 a first SiO$_2$ thin film, reference numeral 806 a tungsten gate electrode, reference numeral 807 a second SiO$_2$ thin film, reference numeral 808 a second undoped GaN layer, reference numeral 809 a second n$^+$-type GaN layer, reference numeral 810 a Ti/Al/Ni/Au source electrode, reference numeral 811 a Ti/Al/Ni/Au drain electrode, and reference numeral 812 a Ti/Au gate pad electrode.

In this case, the AlN buffer layer 802 of 0.5 μm in thickness, the first undoped GaN layer 803 of 3 μm in thickness, and the first n$^+$-type GaN layer 804 of 500 nm in thickness are formed on the sapphire (0001) substrate 801 in that order by using metal organic chemical vapor deposition (MOCVD) (see FIG. 8A).

After the epitaxial growth, the first n$^+$-type GaN layer 804 is selectively removed to form a device isolation area (see FIG. 8B).

In the etching of the first n$^+$-type GaN layer 804, for example, dry etching called ICP (inductive coupled plasma) etching, which uses Cl$_2$ gas, is employed.

Then, on the first n$^+$-type GaN layer 804 and part of the first undoped GaN layer 803 exposed by dry etching, the first SiO$_2$ thin film 805 of 500 nm in thickness, the tungsten gate electrode 806 of 50 nm in thickness, and the second SiO$_2$ thin film 807 of 500 nm in thickness are formed in that order. The first and second SiO$_2$ thin films 805 and 807 are formed by using, for example, chemical vapor deposition (CVD) using SiH$_4$ and O$_2$ and the tungsten gate electrode 806 is formed by using, for example, DC sputtering (see FIG. 8C). In this case, W is used as the gate electrode, while a single metal such as Mo, Pt, or Pd, a silicide, or a conductive oxide film may be used.

Moreover, for example, a 0.2-μm-wide opening is formed in the multilayer film comprised of the first and second SiO$_2$ thin films 805 and 807 and the tungsten gate electrode 806. The opening is made by using reactive ion etching (RIE) employing a gas such as CF$_4$ or SF$_6$.

Following the step of forming the small opening, the second undoped GaN layer 808 of 1.2 μm in thickness and the second n$^+$-type GaN layer 809 of 50 nm in thickness are formed so that they are regrown selectively via the opening by using MOCVD (see FIG. 8D).

In the regrowing process, conditions of gas, temperature, and growing pressure, under which no deposition develops on the SiO$_2$ thin film 807, are selected. The temperature at which the second undoped GaN layer 808 and the second n$^+$-type GaN layer 809 are formed is set at a temperature at which the gate electrode does not degrade, that is, the composition of the gate electrode does not change. It is desirable that the first and second n$^+$-type GaN layer 804 and 809 be doped with Si in high concentrations. For example, the layers 804 and 809 are doped with Si in a concentration of up to about $1 \times 10^{19}$ cm$^{-3}$.

The multilayer film comprised of the tungsten gate electrode 806 and the first and second SiO$_2$ thin films 805 and 807 is selectively patterned on the first n$^+$-type GaN layer 804. And then, as shown in FIG. 8E, the Ti/Al/Ni/Au drain electrode 811 is formed on the first n$^+$-type GaN layer 804 and the Ti/Al/Ni/Au source electrode 810 is formed on the regrowth layer. The source electrode 810 and the drain electrode 811 are made of the same material and therefore, they can be concurrently formed in one photolithography process step by using, for example, electron-beam evaporation and lift-off.

Furthermore, as shown in FIG. 8F, an opening is formed in the second SiO$_2$ thin film 807 to expose a part of the tungsten gate electrode 806, after which the Ti/Au gate pad electrode 812 is formed so that the electrode 812 contacts the tungsten gate electrode 806.

In addition to these steps, to form the mask patterns shown in FIGS. 4 and 6, it is preferable that, for example, a passivation film such as a SiN thin film be formed after the formation of the structure shown in FIG. 8F, openings be formed at portions where the passivation film is in contact with the source pad, the drain pad, and the gate pads, and metal wiring be formed on the openings by, for example, Au plating.

In order to form the area for the device isolation, a device peripheral area may be selectively oxidized by, for example, heating the portion at a temperature of about 1000° C. in an atmosphere of O$_2$ to substantially reduce device isolation leakage currents.

In this case, the sapphire substrate is used, while a SiC substrate, a GaN substrate, or a Si substrate may be used.

When such a conductive substrate is used, a step of forming a via hole through the selective removal of the first n+-type GaN layer, the first undoped GaN layer, and the AlN buffer layer at the portion where the drain electrode (or the source electrode) is formed is included and the drain electrode (or the source electrode) is connected to the conductive layer through the removed portion, i.e., the so-called via hole. Or alternatively, the thickness of the conductive substrate may be reduced to form an electrode on the back side surface of the substrate as a drain electrode (or a source electrode).

In addition, for example, a $SiO_2$ mask layer having a stripe-shaped opening may be formed on the AlN buffer layer 802 formed on the sapphire substrate 801, and then the first undoped GaN layer 803 and the first n+-type GaN layer 804 may be regrown. Such a structure reduces the crystal defect densities of the portions of the first undoped GaN layer 803 and the first n+-type GaN layer 804 on the unopened portion of the $SiO_2$ mask layer. A vertical channel is formed in the reduced defect portion thus obtained. However, since the crystal defect densities of the portions of the first undoped GaN layer 803 and the first n+-type GaN layer 804 on the stripe-shaped opening of the $SiO_2$ mask layer are high when compared with their other portions, it is preferable that the vertical channel be not provided on these portions.

As described above, the reduction in the crystal defects of the first undoped GaN layer 803 and the first n+-type GaN layer 804 improves the reliability of the field effect transistor.

According to the embodiment of the invention, it is possible to implement the vertical field effect transistor having a lower contact resistance at the source electrode (or the drain current) on the second n+-type GaN layer and a low series resistance as mentioned above. Moreover, since the so-called gate length is determined according to the thickness of the tungsten gate electrode film instead of controlling the gate length according to the pattern size, the gate length can be easily shortened by reducing the thickness of the film further.

A second embodiment according to the invention will be described with reference to FIG. 9.

Figure 9:
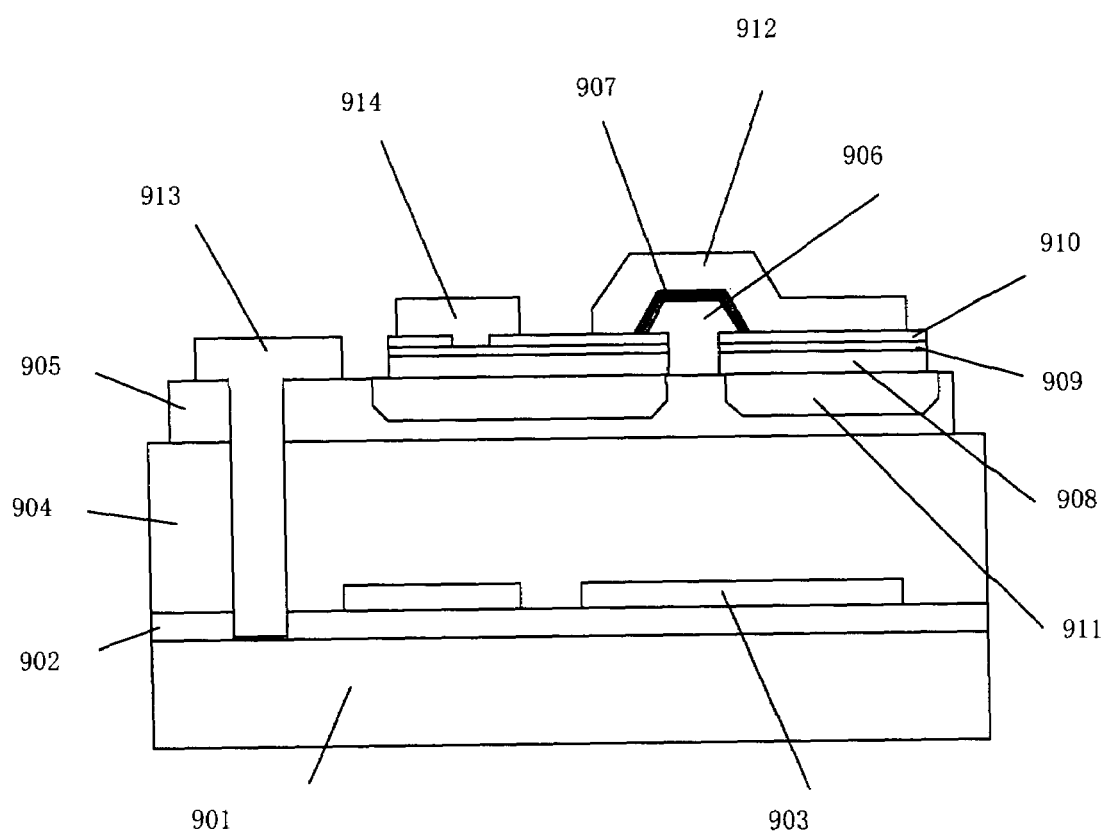
FIG. 9 is a cross-sectional view of a field effect transistor with a vertical channel according to a second embodiment of the invention.

FIG. 9 is a cross-sectional view of a field effect transistor with a vertical channel according to the second embodiment of the invention. In FIG. 9, reference numeral 901 denotes a conductive Si substrate, reference numeral 902 an AlN buffer layer, reference numeral 903 a $SiO_2$ mask layer, reference numeral 904 a first undoped GaN layer, reference numeral 905 a n+-type GaN layer (first contact semiconductor layer), reference numeral 906 a second undoped GaN layer (channel semiconductor layer), reference numeral 907 a n+-type InAlGaN layer (second contact semiconductor layer), reference numeral 908 a first $SiO_2$ thin film, reference numeral 909 a tungsten gate electrode, reference numeral 910 a second $SiO_2$ thin film, reference numeral 911 a high-resistance region, reference numeral 912 a Ti/Al/Ni/Au source electrode, reference numeral 913 a Ti/Al/Ni/Au drain electrode, and reference numeral 914 a Ti/Au gate pad electrode.

Also, the n+-type GaN layer 905 may be replaced with a n+-type InAlGaN layer.

In the field effect transistor with the vertical channel according to the second embodiment shown in FIG. 9, the $SiO_2$ thin film 908, the tungsten (W) gate electrode 909, and the $SiO_2$ thin film 910 which have an opening are formed on the n+-type GaN layer 905. Via the opening, the second undoped GaN layer 906 and the n+-type InAlGaN layer 907 are formed. And further, the Ti/Al/Ni/Au drain electrode 913 is formed so that the electrode 913 contacts the n+-type GaN layer 905 and the Ti/Al/Ni/Au source electrode 912 is formed so that the electrode 912 contacts the n+-type InAlGaN layer 907.

The structure of the field effect transistor according to the second embodiment is basically the same as that of FIG. 1 described in the first embodiment, but the former differs from the latter in the following respects: a first point of the differences is that the high-resistance region is formed in the n+-type GaN layer 905 under the $SiO_2$ thin film beneath the gate electrode by using, for example, B ion implantation; a second point of the differences is that for the purpose of connecting the drain electrode to the conductive Si substrate, a via hole is formed by using the conductive Si substrate; and a third point of the differences is that as the contact layers, the InAlGaN quaternary layers are used instead of the GaN layers.

In this case, the AlN buffer layer 902 of 0.5 μm in thickness is formed on the surface (111) of the n+-type conductive Si substrate 901, and then the $SiO_2$ mask layer 903 is selectively formed on the AlN buffer layer 902. And further, the first undoped GaN layer 904 of 3 μm in thickness and the n+-type GaN layer 905 of 500 nm in thickness are formed on them in that order.

Moreover, the first $SiO_2$ thin film 908 of 500 nm in thickness, the tungsten gate electrode 908 of 50 nm in thickness, and the second $SiO_2$ thin film 910 of 1 μm in thickness are selectively formed on the n+-type GaN layer 905 in that order.

In this case, W is used as the gate electrode, while a conductive oxide such as ITO, ZnO, or ITO containing Zn and so on may be used. The Ti/Al/Ni/Au drain electrode 913 is formed on the first n+-type GaN layer 905 on which the multilayer film composed of the first and second $SiO_2$ thin films 908 and 910 and the tungsten gate electrode 909 is not formed. Under the Ti/Al/Ni/Au drain electrode 913, the hole penetrating the first n+-type GaN layer 905, the first undoped GaN layer 904, and the AlN buffer layer 902, that is, the so-called via hole is formed. Through the via hole, the Ti/Al/Ni/Au drain electrode 913 is electrically connected to the conductive Si substrate 901.

Device isolation is carried out by selectively removing the first n+-type GaN layer 905 on the first undoped GaN layer 904. The high-resistance layer 911 is formed in such a way that the layer 911 is included in the first undoped GaN layer 904 under the first $SiO_2$ thin film 908. The high-resistance layer 911 is formed by selectively implanting ions such as B or O. And further, in the multilayer film composed of the $SiO_2$ thin films 908 and 910 and the tungsten gate electrode 909, the opening is formed in the shape of, for example, a 0.2-μm-deep stripe and via the opening, the second undoped GaN layer 906 of 2.5 μm in thickness and the n+-type InAlGaN layer 907 of 50 nm in thickness are formed so that they are regrown selectively.

In this case, the InAlGaN layer is formed with a composition of, for example, $In_{0.09}Al_{0.33}Ga_{0.58}N$ to effect lattice matching to GaN and the Schottky barrier height of a metal formed on the layer is low, thereby the electrode contact resistance can be lowered further when compared with that of the GaN layer.

It is desirable that the first n+-type GaN layer 905 and the n+-type InAlGaN layer 907 be doped with Si in high concentrations. For example, they are doped with Si in a concentration of up to about $1 \times 10^{19}$ cm$^{-3}$.

As shown in FIG. 9, the Ti/Al/Ni/Au source electrode 912 is selectively formed on the regrowth layer. And furthermore, an opening is provided in the second $SiO_2$ thin film 910, and then the Ti/Au gate pad electrode 914 is formed so as to contact the tungsten gate electrode 909.

In such a structure, as in the case of the first embodiment, a current flowing between the source electrode 912 and the drain electrode 913 is controlled by a depletion layer which is formed in the regrowth undoped GaN layer by applying a negative voltage to the tungsten gate electrode 909, thereby the operation of the field effect transistor can be achieved.

According to the second embodiment of the invention, it is possible to realize the vertical field effect transistor having a lower contact resistance at the source electrode and a low series resistance. Besides, since the so-called gate length is determined based on the thickness of the tungsten gate electrode film, the gate length can be easily shortened by reducing the thickness of the electrode film further.

Moreover, by using the structure described in this embodiment, the gate length of 50 nm or less, which has been very difficult to be achieved in the conventional horizontal field effect transistors, can be achieved without necessitating a high-cost process step such as electron-beam lithography, so that it becomes possible to realize the high-performance field effect transistor at a lower cost.

Furthermore, since the substrate possesses electrical conductivity and the drain electrode is connected to the substrate through the via hole, there is no need to form a metal pad for the drain electrode on the top surface of the substrate, thereby the chip area can be reduced further. Besides, by increasing the number of the via hole, the series resistance can be lowered further. In addition, by forming the high-resistance region under the gate electrode, the parasitic resistance can be lowered further and the high-frequency characteristics can be improved further.

In the second embodiment, the field effect transistor may have a structure in which the drain electrode is formed above the opening of the gate electrode by interchanging the source electrode and the drain electrode.

A third embodiment according to the invention will be described with reference to FIGS. 10 to 12.

Figure 10:
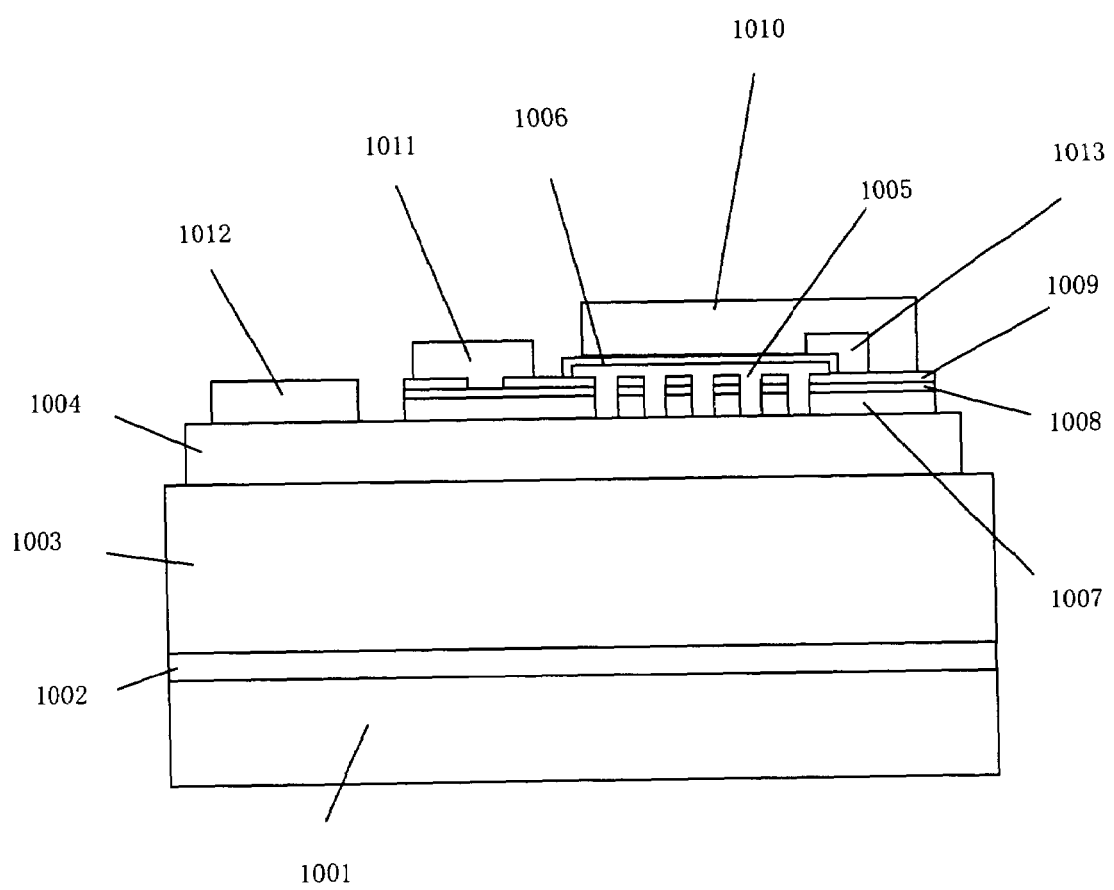
FIG. 10 is a cross-sectional view of a field effect transistor with a vertical channel according to a third embodiment of the invention.

FIG. 10 is a cross-sectional view of a field effect transistor having a vertical channel according to the third embodiment of the invention. In FIG. 10, reference numeral 1001 denotes a sapphire substrate, reference numeral 1002 an AlN buffer layer, reference numeral 1003 a first undoped GaN layer, reference numeral 1004 a first n$^+$-type GaN layer (first contact semiconductor layer), reference numeral 1005 a second undoped GaN layer (channel semiconductor layer), reference numeral 1006 a second n$^+$-type GaN layer (second contact semiconductor layer), reference numeral 1007 a first SiO$_2$ thin film, reference numeral 1008 an ITO gate electrode, reference numeral 1009 a second SiO$_2$ thin film, reference numeral 1010 a Ti/Al/Ni/Au source electrode having Au/plate wiring on its top surface, reference numeral 1011 a Ti/Au gate pad electrode, reference numeral 1012 a Ti/Al/Ni/Au drain electrode, and reference numeral 1013 an air-bridge gap portion.

In the field effect transistor having the vertical channel according to the third embodiment shown in FIG. 10, the first SiO$_2$ thin film 1007, the ITO gate electrode 1008, and the second SiO$_2$ thin film 1009 which have openings are formed on the first n$^+$-type GaN layer 1004, the second undoped GaN layer 1005 and the second n$^+$-type GaN layer 1006 are formed via the openings, the Ti/Al/Ni/Au drain electrode 1012 is formed so that the electrode 1012 contacts the first n$^+$-type GaN layer 1004, and the Ti/Al/Ni/Au source electrode 1010 is formed so that the electrode 1010 contacts the second n$^+$-type GaN layer 1006.

The structure of the field effect transistor according to the third embodiment is basically the same as that of FIG. 1 described in the first embodiment, while the former differs from the latter in the following respects. A first point of the differences is that ITO is used as the gate electrode instead of W. A second point of the differences is that the second undoped GaN layer 1005, which has been regrown via the openings, is continuously grown thick until its adjacently regrown portions are connected to one another on the second SiO$_2$ thin film 1009 and planarized. In this case, the individual portions of the second undoped GaN layer 1005, which have been grown via the opening, may be connected to one another by the second n$^+$-type GaN layer 1006 to be regrown on the layer 1005. A third point of the differences is that a breakdown voltage between the gate and the source, which is roughly determined by the breakdown voltage of the second SiO$_2$ thin film 1009, is increased by the source electrode 1010 having the air-bridge structure.

In this embodiment, the AlN layer 1002 of 0.5 µm in thickness, the first undoped GaN layer 1003 of 3 µm in thickness, and the first n$^+$-type GaN layer 1004 of 500 nm in thickness are formed on the (0001) plane of the sapphire substrate 1001 in that order. And then, the first SiO$_2$ thin film 1007 of 500 nm in thickness, the ITO gate electrode 1008 of 50 nm in thickness, and the second SiO$_2$ thin film 1009 of 1 µm in thickness are selectively formed on the first n$^+$-type GaN layer 1004 in that order.

In this case, ITO is used as the gate electrode, while a conductive oxide such as ZnO or ITO containing Zn etc. may be used. Also, high-melting single metals such as W described in the first embodiment may be used.

The Ti/Al/Ni/Au drain electrode 1012 is formed on the first n$^+$-type GaN layer 1004 on which the multilayer film composed on the first and second SiO$_2$ thin films 1007 and 1009 and the ITO electrode 1008 is not formed. Besides, the first n$^+$-type GaN layer 1004 is selectively removed on the first undoped GaN layer 1003 for device isolation.

Furthermore, the plurality of openings in the shape of, for example, a stripe of 0.2 µm in thickness are formed in the multilayer film composed of the first and second SiO$_2$ thin films 1007 and 1009 and the ITO electrode 1008 and via the openings, the second undoped GaN layer 1005 of 2.5 µm in thickness and the second n$^+$-type GaN layer 1006 of 50 nm in thickness are formed so that the layers are regrown selectively. And then, the individual portions of the second undoped GaN layer 1005 regrown via the adjacent openings are connected to one another and planarized.

According to the third embodiment, it is possible to increase the cross-sectional area of the channel portion in a unit area when compared with that described in the first embodiment, so that a large drain current can be realized at a small chip area. It is desirable that the first and second n$^+$-type GaN layers 1004 and 1006 be doped with a high concentration of Si. For example, the doping is performed in a concentration of up to about $1 \times 10^{19}$ cm$^{-3}$.

Moreover, as shown in FIG. 10, the Ti/Al/Ni/Au source electrode 1010 is selectively formed on the regrowth layers. The metal wiring and the source pad electrode, which have the air-bridge structure shown in FIG. 10, are formed from the Ti/Al/Ni/Au source electrode 1010 by using, for example, Au plating or the like. By providing the air-bridge gap portion 1013 shown in FIG. 10, the breakdown voltage between the gate and the drain, which is roughly determined by the breakdown voltage of the second SiO$_2$ thin film 1009 as in the case of the first embodiment shown in FIG. 1, can be increased.

Moreover, an opening is provided in the second SiO$_2$ thin film 1009 and the Ti/Au gate pad electrode 1011 is formed so that the electrode 1011 contacts the ITO gate electrode 1008. As in the case of the first embodiment, a current flowing between the source and the drain is controlled by a depletion layer formed in the second undoped GaN layer regrown 1005 by applying a negative voltage to the ITO gate electrode 1008, thereby the operation of the field effect transistor can be realized.

In the field effect transistor according to the third embodiment, after the crystal growth of the second undoped GaN layer 1005 is stopped so that the regrowth layer is not formed until it is planarized and roughnesses are left on its surface, and then the layer 1005 is planarized by using, for example, polishing or etching, the second $n^+$-type GaN contact layer 1006 may be formed. In this case, the thickness of the second undoped GaN layer 1005 can be reduced, so that it becomes possible to lower the series resistance further.

In this embodiment, the sapphire substrate is used, while a SiC substrate, a GaN substrate, and a Si substrate may be used. When such conductive substrates are used, a structure may be used in which the first $n^+$-type GaN layer is connected to the conductive substrate through, for example, a via hole and metal wiring, and then a drain electrode or a source electrode is formed on the rear surface of the surface.

According to the embodiment of the invention, it is possible to realize the vertical field effect transistor having a lower contact resistance at the source electrode and a lower series resistance. Besides, since the so-called gate length is determined based on the thickness of the ITO gate electrode film, the gate length can be easily shortened by reducing the thickness further.

In addition, by using the structure described in the embodiment, the gate length of 50 nm or less, which has been very difficult to be achieved in the conventional horizontal field effect transistors, can be achieved without necessitating a high-cost process step such as electron-beam lithography, so that it becomes possible to realize the higher-performance field effect transistor at a lower cost.

Incidentally, in this case, the drain electrode may be formed above the opening of the gate by interchanging the source electrode and the drain electrode.

Figure 11:
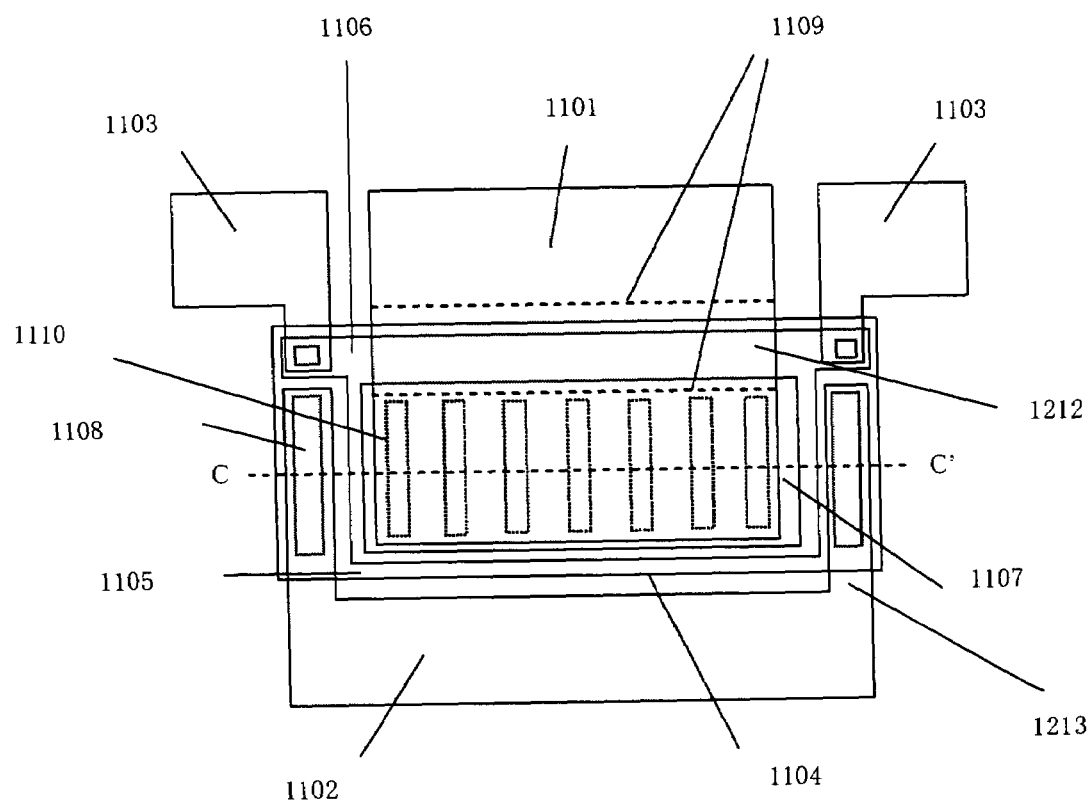
FIG. 11 is a layout of a mask pattern formed in a state where the field effect transistor with the vertical channel according to the third embodiment of the invention is applied to a high-power transistor.

FIG. 11 is an example of a layout on a mask of the vertical channel field effect transistor whose cross-sectional structure is shown in FIG. 10. In FIG. 11, reference numeral 1101 denotes a source pad electrode composed of Au-plated wiring, reference numeral 1102 a drain pad electrode composed of Au-plated wiring, reference numeral 1103 a gate pad electrode composed of Au-plated wiring, reference numeral 1104 is a device isolation stage, reference numeral 1105 the first $n^+$-type GaN layer on the drain side, reference numeral 1106 the second $SiO_2$ thin film, reference numeral 1107 the Ti/Al/Ni/Au source electrode formed on the second $n^+$-type GaN layer on the source side, reference numeral 1108 the Ti/Al/Ni/Au drain electrode, and reference numeral 1110 openings in the gate electrode. Reference numeral 1109 denotes boundaries of the air-bridge portion and a portion between two dotted lines is the air-bridge portion. Reference numeral 1212 denotes Au-plated source wiring connected to the source pad electrode 1101 and reference numeral 1213 denotes Au-plated drain wiring connected to the drain pad electrode 1102.

Figure 12:
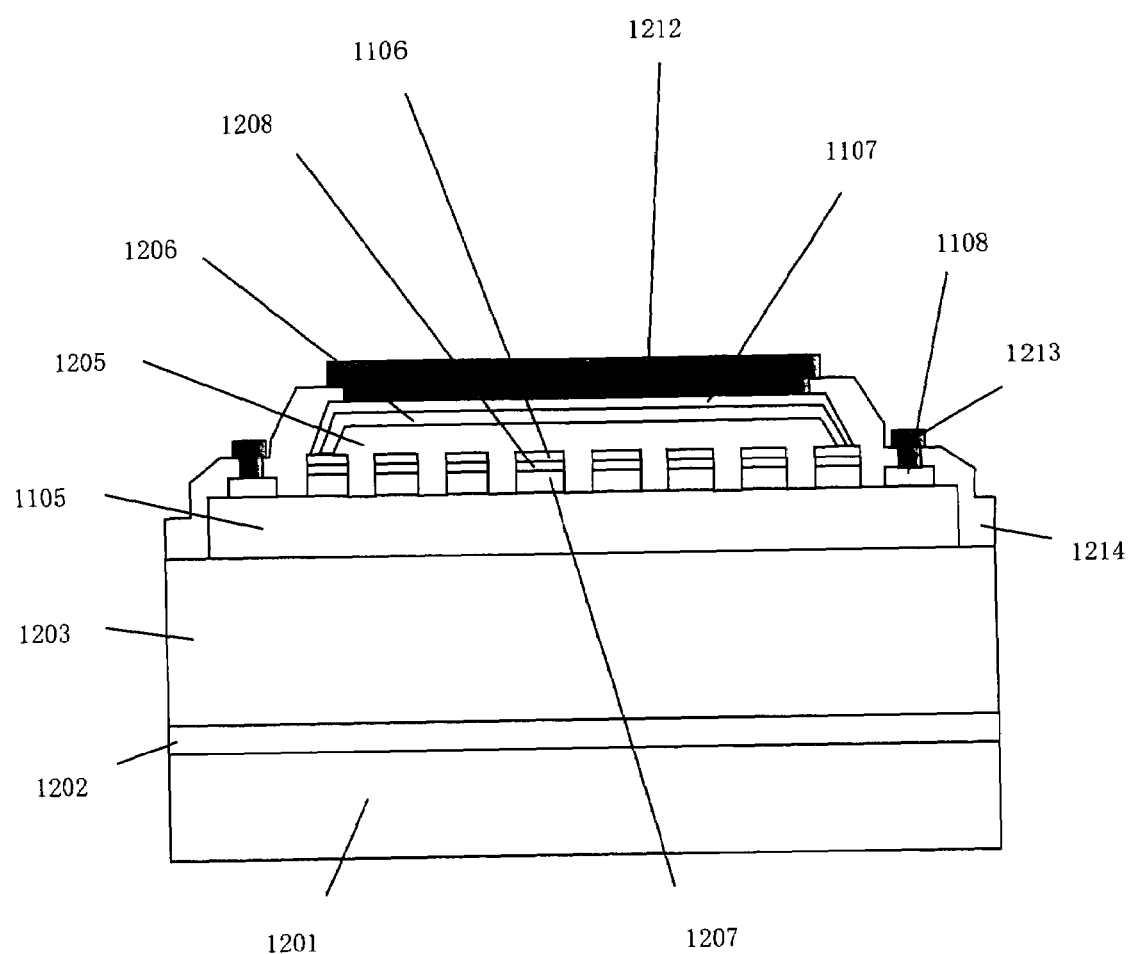
FIG. 12 is a cross-sectional view of the field effect transistor taken along line C-C' of FIG. 11.
Figure 13:
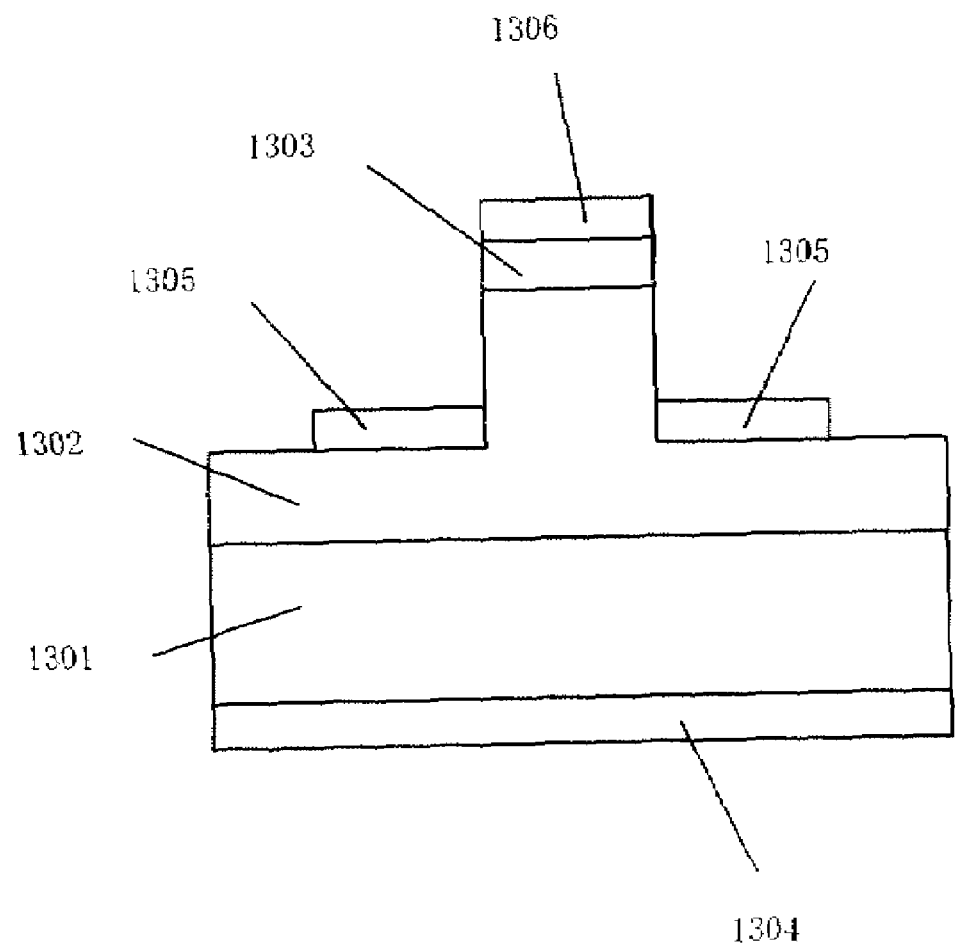
FIG. 13 is a cross-sectional view of an example of a conventional field effect transistor with a vertical channel.

FIG. 12 is a cross-sectional view of the field effect transistor taken along line C-C' of FIG. 11. In FIG. 12, reference numeral 1201 denotes the sapphire substrate, reference numeral 1202 the AlN buffer layer, reference numeral 1203 the first undoped GaN layer, reference numeral 1105 the first $n^+$-type GaN layer, reference numeral 1205 the second undoped GaN layer, reference numeral 1206 the second $n^+$-type GaN layer, reference numeral 1207 the first $SiO_2$ thin film, reference numeral 1208 a tungsten gate electrode, reference numeral 1106 the second $SiO_2$ thin film, reference numeral 1107 the Ti/Al/Ni/Au source electrode, reference numeral 1108 the Ti/Al/Ni/Au drain electrode, reference numeral 1212 the Au-plate source wiring connected to the source pad electrode, reference numeral 1213 the Au-plated drain wiring connected to the drain pad electrode, and reference numeral 1214 a SiN passivation film under the metal wiring.

FIG. 11 is a layout drawing of a mask pattern formed in a case where, for example, the vertical field effect transistor according to the second embodiment is applied to a high-power transistor for power supply circuits. The plurality of openings of the gate electrode and the $SiO_2$ thin films for the formation of the regrowth layers are provided as is apparent from its cross section shown in FIG. 12 and the regrowth layers are formed so that they are connected to one another and planarized. As a result, the cross-sectional area of the channel is increasd, thereby drain currents are increased further.

In this case, unlike the shape of the source electrode in the layout shown in FIG. 6, the source electrode is rectangular and the contact resistance of the source electrode is low when compared with that in the layout shown in FIG. 6. The portion between the two dotted lines (boundary portions of the air bridge 1109) in the source electrode of FIG. 11 is the air-bridge portion. In this embodiment, the openings 1110, which formed in the multilayer film composed of the tungsten gate electrode 1208 and the $SiO_2$ thin films 1207 and 1106 constituting the regrowth layer, are plurally provided in the rectangular shape; however, for example, a plurality of 0.2-μm-diameter hole arrays may be provided. Besides, a structure may be formed in which the wiring metal, which is formed in the so-called via hole formed in the first undoped GaN layer, is connected to a conductive substrate such as a Si substrate and a drain electrode is formed on the back side surface of the conductive substrate. In that case, there is no need to form the drain pad electrode on the mask pattern on its surface side, thereby the chip area can be reduced further.

In the embodiments shown in FIGS. 1, 7, etc., only the group III nitride semiconductor represented by GaN has been shown, while any semiconductor materials such as Si and GaAs can be used in addition to the group III nitride. Besides, the sapphire substrate may have any plane direction and hence, may have, for example, a plane direction off-angled from a representative plane such as a (0001) plane. The substrate may be comprised of GaN, SiC, ZnO, Si, GaAs, GaP, InP, $LiGaO_2$, $LiAlO_2$, their mixed crystals, or the like.

With the buffer layer, in addition to the AlN layer, a GaN layer or a group III nitride semiconductor layer having any composition ratio may be used as long as a favorable GaN crystal can be formed on the buffer layer.

The epitaxial growth layers of the field effect transistor described herein may be formed of the group III nitride semiconductor having any composition ratio or may have any multilayer structure as long as desired transistor characteristics can be achieved. Moreover, the growth layers may contain a layer which is formed by using a crystal growing method such as molecular beam epitaxy (MBE) or hydride vapor phase epitaxy (HVPE) instead of MOCVD. The epitaxial growth layers may contain group V elements such as As and P or group III elements such as B as constituent elements.

Since the semiconductor layers are formed on the substrate by using epitaxial growth as described above, the group III nitride semiconductor epitaxial growth layer with better crystallinity can be formed on the substrate and hence, it becomes possible to realize the high-performance field effect transistor having the increased mobility of the carriers.

In addition, it is preferable that epitaxial growth be conducted by using metal organic chemical vapor deposition, molecular beam epitaxy, hydride vapor phase epitaxy, or a combination of these. Through such a crystal growing method, the channel semiconductor layer has high crystallinity and uniformity, so that it is possible to realize, for example, the high-performance field effect transistor with increased carrier mobility, a lower series resistance, and a higher transconductance.

INDUSTRIAL APPLICABILITY

The field effect transistor and the method for manufacturing the same according to the present invention are useful for high-power transistors used in power supply circuits of consumer electronics and high-frequency transistors used in transmitting and receiving circuits of cellular telephones, extremely high-frequency radars, and the like.

What is claimed is:

1. A field effect transistor comprising:
   a first contact semiconductor layer;
   a gate electrode formed above the first contact semiconductor layer;
   an opening which penetrates the gate electrode;
   a channel semiconductor layer formed so that the layer penetrates the opening and the lower portion of the layer contacts the first contact semiconductor layer;
   a second contact semiconductor layer formed so that the layer contacts the upper portion of the channel semiconductor layer;
   a first source or drain electrode formed so that the electrode contacts the first contact semiconductor layer; and
   a second source or drain electrode formed so that the electrode contacts the second contact semiconductor layer, wherein:
   the carrier concentration of the channel semiconductor layer being lower than those of the first and second contact semiconductor layers,
   the contact area of the second contact semiconductor layer and the second source or drain electrode being larger than the area of the opening,
   a conductive substrate is provided below the channel semiconductor layer and the first contact semiconductor layer,
   a through-hole is formed between the top surface of the first contact semiconductor layer and the conductive substrate, and
   the first source or drain electrode, which is formed so that the electrode contacts the first contact semiconductor layer, and the conductive substrate are electrically connected with each other via the through-hole formed in the first contact semiconductor layer.

2. The field effect transistor according to claim 1, wherein the first and second contact semiconductor layers are n-type semiconductor layers.

3. The field effect transistor according to claim 1, wherein the carrier concentration of the second contact semiconductor layer is higher than that of the first contact semiconductor layer.

4. The field effect transistor according to claim 1 having first and second insulating films formed on the corresponding lower and upper portions of the gate electrode and the opening which penetrates the first insulating film, the gate electrode, and the second insulating film.

5. The field effect transistor according to claim 4, wherein the first and second insulating films are made of any one of $SiO_2$, SiN, polyimide, and BCB (benzocyclobutene) or formed of a multilayer film made of at least two of $SiO_2$, SiN, polyimide, and BCB (benzocyclobutene).

6. The field effect transistor according to claim 1, wherein the first contact semiconductor layer with increased resistance is formed below the gate electrode.

7. The field effect transistor according to claim 1, wherein part of the channel semiconductor layer or part of the first contact semiconductor layer is formed below the gate electrode so that the resistance of the part is increased.

8. The field effect transistor according to claim 1, wherein the opening is plurally provided in the same surface of the gate electrode, the channel semiconductor layer and the second contact semiconductor layer are plurally formed so that all the layers penetrate all the openings, and the channel semiconductor layers, the second contact semiconductor layers, or both the layers are connected to one another above the gate electrode.

9. The field effect transistor according to claim 1, wherein the channel semiconductor layer is doped with impurities which increase the resistance of the channel semiconductor layer.

10. The field effect transistor according to claim 9, wherein the channel semiconductor layer is doped with Mg, Zn, or Fe as the impurities.

11. The field effect transistor according to claim 1, wherein the channel semiconductor layer and the first and second contact semiconductor layers are comprised of a compound semiconductor containing nitrogen.

12. The field effect transistor according to claim 11, wherein the compound semiconductor, of which the first contact layer, the second contact layer, or both the contact layers are comprised, is made of an InAlGaN quaternary mixed crystal.

13. The field effect transistor according to claim 11, wherein the gate electrode contains a W layer, a Mo layer, a Ta layer, a Pt layer, a Ni layer, a Pd layer, a layer comprised of silicide, or a conductive oxide film.

14. The field effect transistor according to claim 13, wherein the conductive oxide is comprised of a tin-doped indium oxide (ITO), a zinc oxide (ZnO), an oxide containing ITO and ZnO, or an yttrium barium copper oxide (YBCO).

15. A field effect transistor comprising:
    a first contact semiconductor layer;
    a gate electrode formed above the first contact semiconductor layer;
    an opening which penetrates the gate electrode;
    a channel semiconductor layer formed so that the layer penetrates the opening and the lower portion of the layer contacts the first contact semiconductor layer;
    a second contact semiconductor layer formed so that the layer contacts the upper portion of the channel semiconductor layer;
    a first source or drain electrode formed so that the electrode contacts the first contact semiconductor layer; and
    a second source or drain electrode formed so that the electrode contacts the second contact semiconductor layer, wherein:
    the carrier concentration of the channel semiconductor layer being lower than those of the first and second contact semiconductor layers,
    the contact area of the second contact semiconductor layer and the second source or drain electrode being larger than the area of the opening, and
    an air gap is formed below the region of part of a wiring metal connected to the second source or drain electrode.

* * * * *